United States Patent [19]

Wada et al.

[11] Patent Number: 4,941,128
[45] Date of Patent: Jul. 10, 1990

[54] SEMICONDUCTOR MEMORY DEVICE HAVING MEANS FOR PROVIDING A PRECHARGE VOLTAGE EQUIVALENT TO A PRESCRIBED SELECTION VOLTAGE

[75] Inventors: Shouji Wada, Ohme; Nobuo Komatsu, Akishima; Mitsuhiro Takano, Ohme; Sinichi Miyatake, Ohme; Kazuo Mihashi, Akishima; Hiromi Tsukada, Kokubunji, all of Japan

[73] Assignees: Hitachi, Ltd.; Hitachi VLSI Engineering Corp., both of Tokyo, Japan

[21] Appl. No.: 185,497

[22] Filed: Apr. 25, 1988

[30] Foreign Application Priority Data

Apr. 24, 1987 [JP] Japan ............................ 62-99861
Oct. 28, 1987 [JP] Japan ............................ 62-272683

[51] Int. Cl.$^5$ ............................................ G11C 13/00
[52] U.S. Cl. .................................. 365/203; 365/190; 365/207; 365/230.01

[58] Field of Search ............... 365/203, 207, 233, 231, 365/190, 230.01, 230.03

[56] References Cited

U.S. PATENT DOCUMENTS 4,780,852 10/1988 Kajigaya et al. ..................... 365/203
4,807,190 2/1989 Ishii et al. ............................ 365/203

Primary Examiner—Terrell W. Fears
Attorney, Agent, or Firm—Antonelli, Terry, Stout & Kraus

[57] ABSTRACT

A dynamic type RAM is provided wherein the level of a precharge control signal supplied to a gate of a precharge MOSFET to precharge complementary data lines to a half level is made the half level during a period from the memory access until the selection of the word line, at the latest. Also, the precharge control signal, corresponding to a memory mat selected according to establishing of an address, is set to a low level, while the precharge control signal corresponding to a non-selective memory mat is set to a high level.

9 Claims, 7 Drawing Sheets

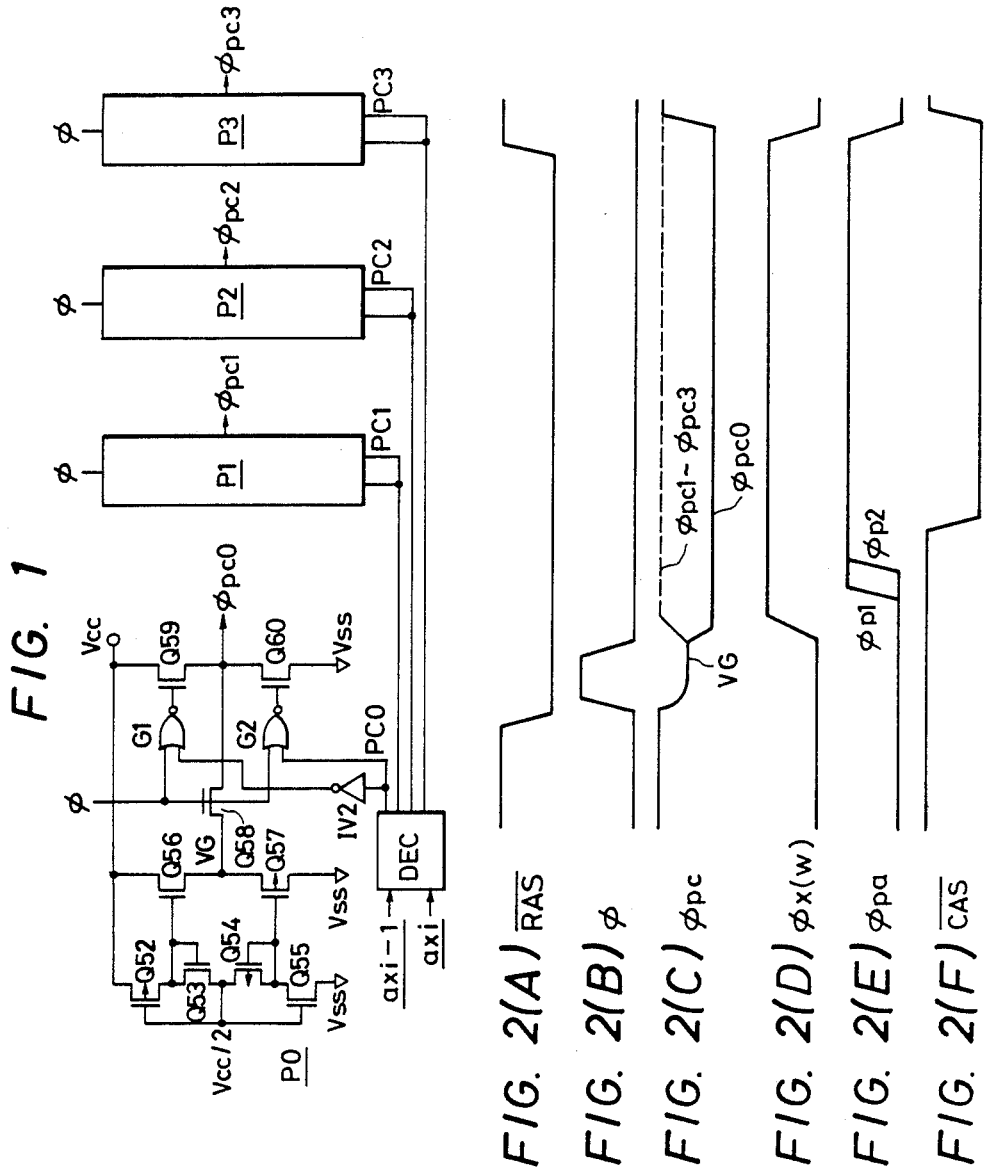

SEMICONDUCTOR MEMORY DEVICE HAVING MEANS FOR PROVIDING A PRECHARGE VOLTAGE EQUIVALENT TO A PRESCRIBED SELECTION VOLTAGE

BACKGROUND OF THE INVENTION

The present invention relates to semiconductor memories and more particularly to a dynamic type RAM (random access memory). The invention relates to significantly effective technology to be utilized in such a RAM which adopts half precharge system and which has a memory mat select function.

A memory cell of one bit in a dynamic type RAM comprises an information storage capacitor Cs and an address selecting MOSFET Qm, and information of logic "1", "0" is stored in the memory cell in the form of whether charge exists or not in the capacitor $C_s$. The information is read in that the MOSFET Qm is turned on and the capacitor $C_s$ is connected to a data line D whereby it is sensed what variation of potential occurs in the data line D corresponding to the charge quantity stored in the capacitor $C_s$. In the abovementioned capacitor $C_s$, MOS capacitance between a gate electrode and a channel is utilized. Consequently, the gate electrode of the capacitor Cs is supplied with the power source voltage stably. Alternatively, according to the ion implantation method, a channel region is formed on a semiconductor surface under the gate electrode of the capacitor $C_s$. As a system of forming the read reference voltage of the memory cell, the so-called half precharge system (or dummy cellless system) which makes precharge of the data line a half level, is disclosed in ISSCC84, DIGEST OF TECHNICAL PAPERS, p276~p277 and in "NIKKEI ELECTRONICS", Feb. 11, 1985, p243~p263, published by NIKKEI McGRAW-HILL.

Half precharge of complementary data lines can be formed in that high level in one data line among the complementary data lines amplified by a sense amplifier and low level in the other data line are short-circuited electrically. In this case, a number of complementary data line pairs are provided with short-circuit MOSFETs respectively. Consequently, gates of the number of short-circuit (precharge) MOSFETs are connected commonly to the precharge signal line. Thereby, a relatively large load (parasitic) capacitance is coupled with the precharge signal line. Also a memory array is constituted by a plurality of memory mats, and a specific mat assigned in address among them is set to a selective state whereby the consumption power can be made low. In this case, after the inputted address signal is established within the dynamic type RAM, a precharge control signal of the memory mat to be selected must be drawn from high level into low level. However, the drawing speed becomes slow because the load capacitance of the precharge signal line is made relatively large. Since the selection timing of the word line must be delayed corresponding to the drawing speed, the operation speed of the dynamic type RAM becomes slow.

A dynamic type RAMs of a shared sense system type is disclosed in IEEE JOURNAL OF SOLID-STATE CORCUITS, vol. SC-77, No. 5 (October, 1972), p336~~p340. In the dynamic type RAM of such a shared sense system, a sense amplifier is arranged at an intermediate portion of complementary data lines, and memory mats are formed on both sides of the sense amplifier. Selection of the memory mats is performed by complementary switch control of the sharing switches such as are constituted by MOSFETs installed in the complementary data lines on both sides of the sense amplifier.

If the storage capacitance of the memory cell is made $C_s$, the parasitic capacitance coupled with the complementary data lines is made $C_b$, and the write voltage is made $V_s$, the signal amount read from the complementary data memory cell into the complementary data lines becomes smaller as the parasitic capacitance of the complementary data lines becomes larger as given by following formula. In the following formula, "$\alpha$" is a constant determined by reading system.

$$V_{sig} = V_s \times \alpha \times C_s/(C_s + C_b)$$

In order to increase the signal amount read from the memory cell into the complementary data lines by a drive operation of the word line to selective level in the selecting operation of the memory cell, in the dynamic type RAM of a shared sense system, the complementary data lines are made non-conductive electrically with each other on both sides of the sense amplifier when a prescribed word line at least is driven to the selective level.

Consequently, in the dynamic type RAM of a shared sense system in the prior art, sharing switches on both sides are initialized to the ON-state in the chip non-selective state, and the sharing switch at a non-selected mat side is turned off based on the address signal supplied from outside in the chip selective state. After the OFF-state of the sharing switch is established, the selective drive of the word line is carried out.

SUMMARY OF THE INVENTION

Consequently, the inventors have considered that the memory access is started irrespective of selection/non-selection of the memory mats and at the same time the short-circuit MOSFETs in all memory mats are turned off. In this constitution, however, since the precharge signal line having a relatively large load capacity is driven, a large consumption power is required. Also in order to lower the potential of the precharge signal line, drawing of the charge stored in the precharge signal line is performed all together. As a result, noise of a relatively large level is generated on the ground potential of the circuit, which may cause deterioration of the operation.

Also in the dynamic type RAM of a shared sense system, the sharing switch is installed to each complementary data line, and a considerable time is required to turn off all sharing switches in the non-selective memory mat. Further the operation margin must be taken also for establishing the switch operation, thereby time is required from the chip selective state until the word line selecting operation and the access time becomes long.

An object of the invention is to provide a semiconductor memory wherein high speed operation and low consumption power are intended.

Another object of the invention is to provide a semiconductor memory of a shared sense system wherein the access time can be decreased.

The foregoing and other objects and novel features of the invention will be apparent from the description of the specification and the accompanying drawings.

An outline of a typical example of the invention disclosed in the application will be briefly described as follows.

From starting of memory access until establishing of an address of row series in the dynamic type RAM, at latest, a high level in one data line of the complementary data line pair and a low level in the other data line thereof are short-circuited, and the level of the precharge control signal supplied to the gate of a precharge MOSFET for precharging the complementary data line pair into half level is made half level. Also, the precharge control signal corresponding to the memory mat selected according to establishing of an address of row series assigned in the dynamic type RAM is converted from the half level into the low level.

According to the above-mentioned means, since the precharge MOSFET can be substantially turned off irrespective of establishing of an address, high speed operation can be performed. Also since the level variation amount of the control signal supplied to gate of the precharge MOSFET in the selected memory mat/nonselected memory mat can be halved, the consumption power becomes low.

BRIEF DESCRIPTION OF THE DRAWINGS

FIG. 1 is a circuit diagram illustrating an embodiment of a precharge control signal generator according to the invention;

FIGS. 2(A)~2(F) are timing charts illustrating an example of operation of a dynamic type RAM according to the invention;

DESCRIPTION OF THE PREFERRED EMBODIMENTS

Figure 3:
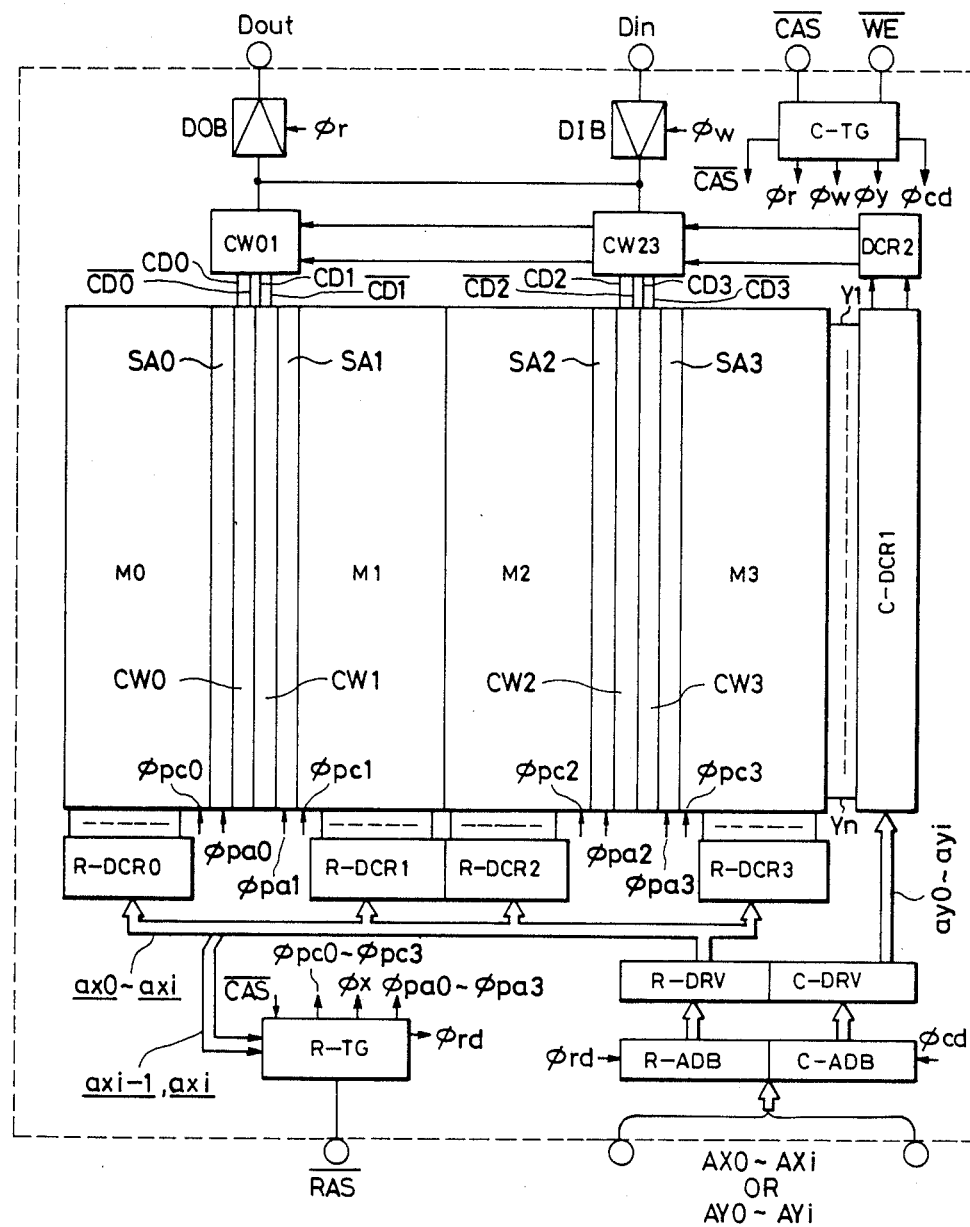
FIG. 3 is an internal constitution block diagram illustrating an embodiment of a dynamic type RAM according to the invention.

FIG. 3 shows a block diagram of an embodiment of a dynamic type RAM according to the invention. In FIG. 3, main circuit blocks surrounded by a broken line are drawn to nearly match with the real geometric arrangement in the semiconductor chip, and formed by known technology of CMOS (complementary MOS) integrated circuitry on a semiconductor substrate made of one monocrystalline silicon, although the invention is not particularly limited thereto.

In various circuits to constitute the RAM, as clearly understood from hereinafter description, respective operations are controlled by various timing signals generated from timing generating circuits R-TG, C-TG of row series and column series respectively. In FIG. 3, however, in order to prevent complication of the drawing, signal lines to be installed between the timing generating circuits R-TG, C-TG of row series and column series and various circuits are omitted.

In the dynamic type RAM of the embodiment, a memory array section comprising memory mats M0 through M3 divided in four is constituted, although not particularly limited thereto. Respective memory mats M0 through M3 are constituted by a folded bit line (data line) system. Consequently each of the memory mats M0 through M3 has a plurality of data lines to be made pairs respectively, i.e., a plurality of complementary data line pairs, a plurality of dynamic type memory cells coupled in respective data input/output terminals with corresponding data lines respectively, and a plurality of word lines with which selective terminals of the dynamic type memory cells are coupled respectively. Although the data lines are not shown in FIG. 3, they are extended in the lateral direction in FIG. 3. The word lines are extended in the longitudinal direction in FIG. 3.

When the memory mats M0 through M3 have the memory cells of the same number in matrix arrangement respectively, they have the same memory capacity. In each of the memory mats M0 through M3, a plurality of complementary data line pairs are coupled respectively with input/output nodes of unit sense amplifiers. In FIG. 3, the unit sense amplifiers installed to the complementary data line pairs in the memory mat M0 are brought together and shown as a sense amplifier SA0. In similar manner, sense amplifiers SA1~SA3 are shown to the memory mats M1~M3.

Among the sense amplifiers SA0 through SA3 corresponding to the memory mats M0 through M3 where memory cells to be selected by timing signals $\phi pa^0$ through $\phi pa^3$ outputted from a row series timing generating circuit R-TG in response to an activation timing signal of the sense amplifier formed based on row address strobe signal $\overline{RAS}$ supplied through an external terminal and decoding signals of row series inner complementary address signals axi-1, axi exist, only one sense amplifier (any one of SA0~SA3) corresponding to one of the memory mats M0 through M3 is set to operation state. It should be understood that the memory mats M0 through M3 as circuit blocks in FIG. 3 respectively include half precharge circuits as hereinafter described.

The RAM shown in the figure has an address selecting circuit for selecting a required memory cell among a plurality of memory cells in each memory mat. The address selecting circuit is composed of a row address buffer R-ADB, a column address buffer C-ADB, row address decoders R-DCR0 through R-DCR3, column address decoders C-DCR1, DCR2, column switch circuits CW0 through CW3 and the like.

In each circuit to constitute the address selecting circuit, respective operations are controlled by timing signals generated from respective timing generating circuits R-TG, C-TG of row series and column series.

To an external terminal of the RAM with which input terminals of the row address buffer R-ADB and the column address buffer C-ADB are coupled, outer row address signals AX0~AXi and column address signals AY0~AYi are supplied in time division according to address multiplex system.

When timing signal $\phi rd$ to take outer row address signals in synchronization with generation of row address strobe signal $\overline{RAS}$ is generated, in response to this, the row address buffer R-ADB takes the row address signals AX0 ~AXi. As a result, the row series inner complementary address signals ax0~axi to be supplied to the row address decoders R-DCR0 through R-DCR3 are outputted from the address buffer R-ADB through an output drive circuit R-DRV. For example, the inner complementary address signal ax0 comprises inner address signal ax0 in the same phase to the outer address signal AX0 and inner address signal ax0 in substantially reverse phase to the outer address signal AX0. In the specification, in order to simplify the description, the inner complementary address signal comprising the inner address signal ax0 and the inner address signal ax0 is designated by ax0. Consequently, each of other inner complementary address signals comprises inner address signals in the same phase and reverse phase in similar manner to the above-mentioned inner complementary address signal ax0.

When timing signal $\phi$cd to take outer column address signals AY0~AYi from the column series timing generating circuit C-TG in synchronization with generation of column address strobe signal $\overline{CAS}$ is generated, in response to this, the column address buffer C-ADB takes the outer column address signals AY0~AYi, and outputs the column series inner complementary address signals ay0~ayi to be supplied through an output drive circuit C-DCR1 to the column address decoder C-DCR1.

The row address decoders R-DCR0 through R-DCR3 are arranged to lower side of the memory mats M0 through M3 in FIG. 3, and respective output terminals are coupled with word lines of the corresponding memory mats. In these row address decoders R-DCR0 through R-DCR3, respective operations are controlled by word line selection timing signal $\phi$x generated from the row series timing generating circuit R-TG, and word line selection signal is outputted in synchronization with the timing signal $\phi$x.

Consequently, the word line of each of the memory mats M0 through M3 is selected when the word line selection signal formed by the row address decoders R-DCR0 through R-DCR3 is supplied. In this case, the row address decoders R-DCR0 through R-DCR3 respectively receive the inner complementary row address signals ax0~axi of all bits and decode them. Consequently, among the memory mats M0 through M3, selection operation of the word line by one row address decoder is performed to only one memory mat where the memory cell to be selected exists, and three residual memory mats remain in non-selective state (low level) of the word lines.

Operation of the column address decoder C-DCR1 is controlled by data line selection timing signal or column selection timing signal $\phi_y$ outputted from the column series timing generating circuit C-TG, and data line selection signal or column selection signal is outputted in synchronization with the timing signal $\phi$y. Although not particularly limited, the column address decoder C-DCR1 is arranged to the right side of the memory mat as shown in the figure. Output lines, i.e., data selection lines (not shown) of the column address decoder C-DCR1 are extended on the memory mats, and coupled respectively with the column switch circuits CW0 through CW3. Since the column address decoder C-DCR1 itself has no direct relation to the invention, the details are not shown. However, the column address decoder C-DCR1 comprises a plurality of unit decoder circuits which supply outputs respectively to each data line selection line.

The column switch circuits CW0 through CW3 are installed respectively between common data line pairs and complementary data line pairs installed corresponding to the memory mats M0 through M3, and the data line selection signal formed by the column address decoder C-DCR1 is commonly supplied thereto. That is, a pair of common data lines CD0, $\overline{CD0}$ are installed to the memory mat M0, and the column switch circuit CD0 is installed between a plurality of complementary data line pair in the memory mat M0 and the common data lines CD0, $\overline{CD0}$ corresponding to the above description. Regarding three other residual memory mats M1~M3 respectively, the common data line pair is installed in similar manner to the memory mat M0, and corresponding column switch circuit is installed. The data line selection signal is commonly supplied to the column switch circuits CW0~CW3 respectively.

In order to select a pair of common data lines (signal of one bit) among the above-mentioned four pairs of common data lines CD0, $\overline{CD0}$~CD3, $\overline{CD3}$ second column switches CW01 and CW23 are installed between the four pairs of common data lines CD0, $\overline{CD0}$~CD3, $\overline{CD3}$ corresponding to the memory mats M0 through M3 and output terminal of a data input buffer DIB and input terminal of a data output buffer DOB. In these second column switch circuits CW01 and CW23, respective operations are controlled by selection signal formed by the second column address decoder circuit DCR2.

Operation of the data input buffer DIB is controlled by write timing signal $\phi_w$ generated from the timing generating circuit C-TG, and write signal is formed corresponding to write signal supplied from an external terminal Din, and supplied to the second column switches CW01 and CW23. When the data input buffer DIB is set to non-operation state, it shows high output impedance characteristics.

Operation of the data output buffer DOB is also controlled read timing signal $\phi_r$ generated from the timing generating circuit C-TG, and read signal outputted through the second column switch circuit CW01 or CW23 is received by the data output buffer DOB, and amplified and transmitted to an external terminal Dout.

The timing generating circuit C-TG to control read/write operation of information receives column address strobe signal $\overline{CAS}$ and write enable signal $\overline{WE}$ supplied from external terminals, thereby it discriminates write/read mode and forms column series corresponding to this and various timing signals.

The row series timing generating circuit R-TG receives row address strobe signal $\overline{RAS}$ supplied from an external terminal, inner complementary address signals axi-1, axi of two bits indicating the memory mats M0 through M3 and inner $\overline{CAS}$ signal, thereby it forms various timing signals of row series. According to the embodiment, among the four memory mats M0 through M3, the word line is set to selective state to only one memory mat where the memory cell to be selected exists. Consequently, timing signals $\phi$pa$^0$ through $\phi$pa$^3$ to activate the sense amplifiers SA0 through SA3 selectively are required. In order to generate such timing signals $\phi$pa$^0$ through $\phi$pa$^3$, the above-mentioned inner complementary address signals axi-1, axi are utilized. Corresponding to select of the memory mats as above described, the timing generating circuit R-TG forms four sorts of precharge control signals $\phi$pc$^0$~$\phi$pc$^3$ to control the precharge MOSFET installed in the memory mats M0~M3 as hereinafter described in detail.

Figure 4:
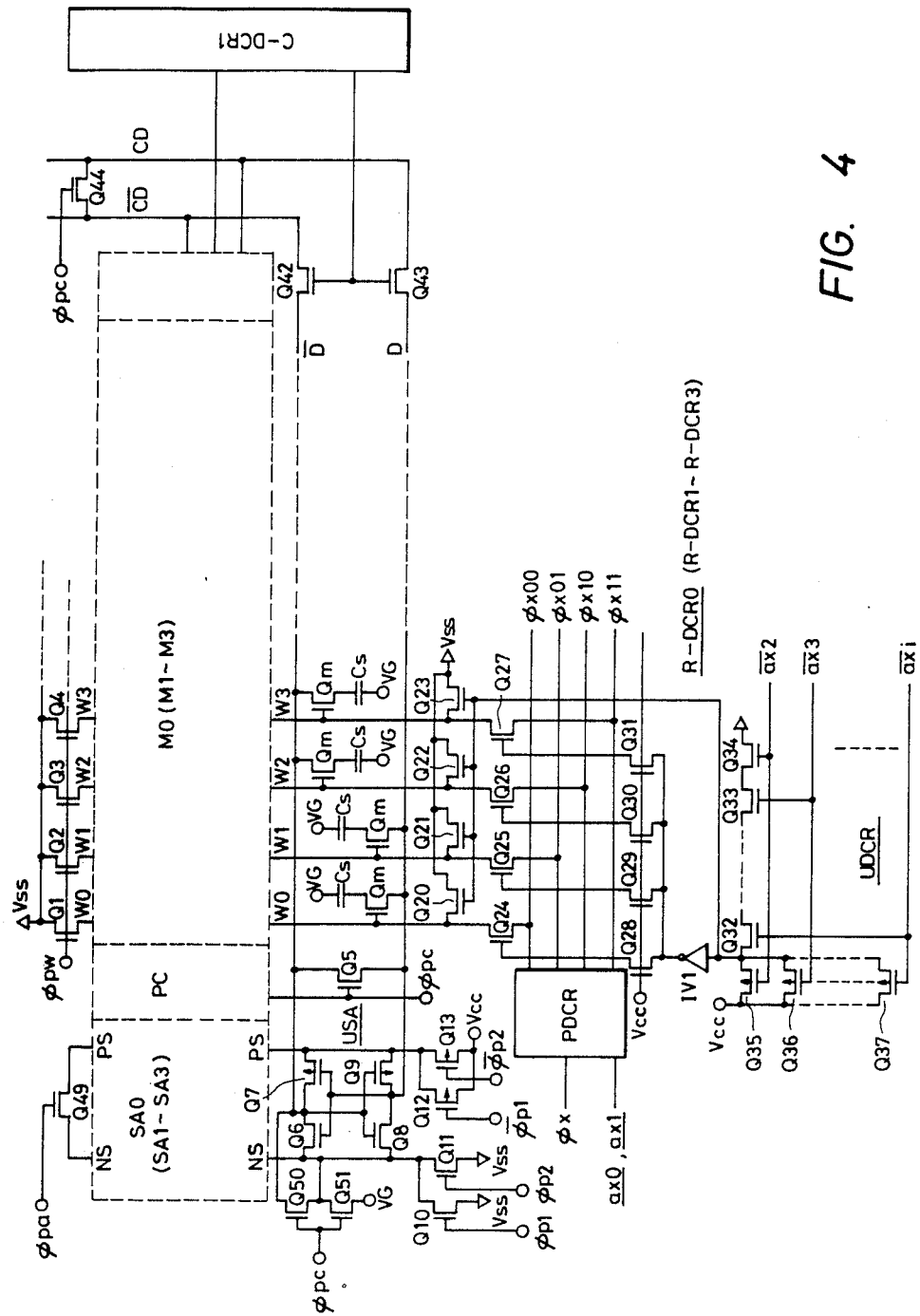
FIG. 4 is a circuit diagram illustrating an embodiment of a memory mat and a peripheral circuit in FIG. 3.

FIG. 4 shows a circuit diagram of an embodiment of the above-mentioned one memory mat M0 and a peripheral circuit thereof. In FIG. 4, MOSFET with channel (back gate) portion having arrow added thereto is P-channel type so that it can be distinguished from N-channel type MOSFET.

Although not particularly limited, the integrated circuit is formed on a semiconductor substrate made of monocrystalline P-type silicon. N-channel MOSFET is constituted by source region and drain region formed on the surface of the semiconductor substrate and a gate electrode of polysilicon formed on the surface of the semiconductor substrate between the source region and the drain region through a thin gate insulation film. P-channel MOSFET is formed in N-type well region formed on the surface of the semiconductor substrate. Thereby the semiconductor substrate constitutes a common substrate gate of a plurality of N-channel MOSFETs formed thereon. The N-type well region constitutes a substrate gate of the P-channel MOSFET formed thereon. The substrate gate of the P-channel MOSFET, i.e., the N-type well region is connected to a power source terminal Vcc in FIG. 4. The semiconductor substrate is supplied with negative back bias voltage formed by a built-in substrate bias voltage generating circuit (not shown). In this constitution, back bias voltage is applied to the substrate gate of the N-channel MOSFET, and parasitic capacitance value between the source region and the drain region and the substrate is decreased, thereby the high speed operation of the circuit is realized.

More concrete structure of the integrated circuit will be broadly described as follows.

Among a surface portion of the semiconductor substrate made of monocrystalline P-type silicon and having N-type well region formed thereon, except for the surface portion made an active region, in other words, except for the surface portion which is made a semiconductor wiring region, a capacitor forming region, and source, drain and a channel forming region (gate forming region) of the N-channel and P-channel MOSFET, a relatively thick field insulation film is formed thereon by known selective oxidation method. In the capacitor forming region, although not particularly limited, a first polysilicon layer is formed through a relatively thin insulation film (oxidation film) onto the capacitor forming region. The first polysilicon layer is extended onto the field insulation film. On the surface of the first polysilicon layer is formed a thin oxidation film by heat oxidation of itself. On the surface of the semiconductor substrate in the capacitor forming region, although not particularly limited, N-type region (channel region) is formed by ion implantation method. Thereby a capacitor comprising the first polysilicon layer, the thin insulation film and the channel region is formed. The first polysilicon layer on the field oxidation film is deemed a sort of wiring.

A second polysilicon layer to be made a gate electrode is formed through a thin gate oxidation film on a surface of the semiconductor region to which a channel region is to be formed. The second polysilicon layer is extended onto the field insulation film and the first polysilicon layer. Although not particularly limited, a word line in the memory mat as hereinafter described is constituted by the second polysilicon layer.

On a surface of the active region which is not covered by the field insulation film and the first and second polysilicon layers, by known impurity introducing technology using these as an impurity introducing mask, source, drain and a semiconductor wiring region are formed.

A relatively thick interlayer insulation film is formed on the surface of the semiconductor substrate including the first and second polysilicon layers, and a conductor layer made of aluminium is formed on the interlayer insulation film. The conductor layer is electrically coupled with the polysilicon layer and the semiconductor region through a contact hole provided in the insulation film under the conductor layer. Although not particularly limited, a data line in the memory mat as hereinafter described is constituted by the conductor layer extended onto the interlayer insulation film.

The surface of the semiconductor substrate including that on the interlayer insulation film and on the conductor layer is covered by a final passivation film such as comprising a silicon nitride film and a phospho silicate glass film.

In FIG. 4, the memory mat M0 is exemplified as representative. Other memory mats M1 through M3 have similar constitution. Consequently, in FIG. 4, addition of the number corresponding to that of the memory mat is omitted in various control signals. For example, the precharge control signal $\phi pc^0$ is supplied to the memory mat M0 as shown in FIG. 3, but the signal is simply shown as $\phi pc$ in FIG. 4. The memory mat M0 (M1~M3) is in system of two points of intersection (folded bit line). Also memory cell rows to constitute the memory mat M0 are in similar constitution to each other. Consequently, a pair of rows are concretely shown as representative in FIG. 4. On a complementary data line pair (bit line or digit line) D, $\overline{D}$ arranged in parallel, respective input/output nodes of a plurality of memory cells constituted by an address selecting MOSFET Qm and an information storing capacitor Cs are distributed with prescribed regularity and coupled as shown in FIG. 4.

The precharge circuit PC is constituted by a switch MOSFET installed between the complementary data line pair D, $\overline{D}$ as in a MOSFET Q5 shown as representative. The MOSFET Q5 is supplied with the precharge control signal $\phi pc$, thereby it is turned on at the chip non-selective state. In cycle of previous operation (read operation, write operation), by amplifying operation of the sense amplifier SA0 as hereinafter described, high level (potential Vcc) and low level (the ground potential of the circuit) supplied to the complementary data lines D, $\overline{D}$ are short-circuited, and potential of the complementary data lines D, $\overline{D}$ respectively is made precharge voltage of about Vcc/2. Before the RAM is set to chip non-selective state and the precharge MOSFET Q5 is turned on, the sense amplifier SA0 is set to non-operation state. Thereby potential of the complementary data line pair D, $\overline{D}$ at high impedance state holds the high level and the low level by charge stored in parasitic capacitance (not shown). When the RAM is set to operation state, potential of precharge control signal $\phi pc$ (all of $\phi pc^0 \sim \phi pc^3$) of each of the memory mats M0 through M3 is made half level (Vcc/2). Thereby all precharge MOSFETs are turned off. Among the precharge control signals $\phi pc^0 \sim \phi pc^3$, one precharge control signal corresponding to the memory mat to be selected is converted from half level into low level, and three precharge control signals corresponding to non-selective memory mats are converted from half level into high level. In the memory mat to be selected, the precharge MOSFET Q5 or the like is turned off before the word line is selected. Thereby the complementary data line pair D, $\overline{D}$ respectively at high impedance state holds the half precharge level until the word line starts the selection operation according to charge stored in the parasitic capacitance coupled with the data lines.

In such half precharge system, since precharge of the complementary data lines is executed by short-circuiting the high level and the low level of the complementary data lines D, $\overline{D}$ simply, low consumption power is realized. Since the word line is selected and then the sense amplifier SA starts the amplifying operation, respective potentials of the complementary data lines D, $\overline{D}$ with respect to the precharge level vary in common mode such as high level and low level according to storage information of the memory cell coupled with the selected word line. For example, the complementary data line D varies to high level, and the complementary data line $\overline{D}$ varies to low level. Consequently, for example, noise level generated by capacitive coupling between the complementary data line pair and the semiconductor substrate can be reduced.

The sense amplifier SA0 (SA1~SA3) is constituted by a plurality of unit sense amplifier circuits as previously described. Since these unit circuits have similar constitution to each other, one unit circuit USA is exemplified in FIG. 4. The unit circuit USA is constituted by a CMOS latch circuit comprising P-channel MOSFETs Q7, Q9 and N-channel MOSFETs Q6, Q8, and a pair of input/output nodes thereof are coupled with the complementary data lines D, $\overline{D}$. Although not particularly limited, the latch circuit is supplied with the power source voltage Vcc through P-channel MOSFETs Q12, Q13 in parallel connection, and supplied with the ground voltage Vss of the circuit through P-channel MOSFETs Q10, Q11 in parallel connection. These power switches MOSFETs Q10, Q11 and MOSFETs Q12, Q13 are commonly used to a latch circuit (unit circuit) installed on other similar row within the same memory mat M0. In other words, P-channel MOSFET and N-channel MOSFET in each unit circuit within the same memory mat are commonly connected in respective sources PS and SN.

In the embodiment, timing signal $\phi pa$ ($\phi pa^0 \sim \phi pa^3$) to activate the sense amplifier SA is composed of two complementary timing signals $\phi p^1$, $\overline{\phi p^1}$ and $\phi p^2$, $\overline{\phi p^2}$. The complementary timing pulse $\phi p^1$, $\overline{\phi p^1}$ is applied to gate of the MOSFETs Q10, Q12, and the complementary timing pulse $\phi p^2$, $\overline{\phi p^2}$ delayed from the above-mentioned timing pulse $\phi p^1$, $\overline{\phi p^1}$ is applied to gate of the MOSFETs Q11, Q13. In this constitution, operation of the sense amplifier SA is divided into two steps. When the timing pulse $\phi p^1$, $\overline{\phi p^1}$ is generated, that is, in the first step, according to current limiting function by the MOSFETs Q10 and Q12 having relatively small conductance, small read voltage supplied between a pair of data lines from the memory cell is amplified without being subject to unrequired level variation. Potential difference between a pair of complementary data lines is increased by the amplifying operation of the sense amplifier SA, and then the timing pulse $\phi p^2$, $\overline{\phi p^2}$ is generated. That is, in the second step, the MOSFETs Q11, Q13 having relatively large conductance are turned on. The amplifying operation of the sense amplifier SA is made rapid when the MOSFETs Q11, Q13 are turned on. Since the amplifying operation of the sense amplifier SA is performed in two steps, potential of the complementary data lines is prevented from being subject to unrequired level variation and data can be read at high speed.

The row decoder R-DCR0 (R-DCR1~R-DCR3) is constituted by combination of row decoders PDCR and UDCR divided in two although not particularly limited thereto. In FIG. 4, a unit row decoder (four word lines) UDCR is shown as representative. According to constitution shown in FIG. 4, a NAND circuit by a CMOS circuit constituted by N-channel MOSFETs Q32~Q34 and P-channel MOSFETs Q35~Q37 receiving inner address signals $\overline{ax2} \sim \overline{axi}$ forms word line selection signal to select four word lines. Output of the NAND circuit is inverted by a CMOS inverter IV1, and transmitted through cut MOSFETs Q28~Q31 to gate of transmission gate MOSFETs Q24~Q27 as a switch circuit.

Although a concrete circuit thereof is not shown, the predecoder PDCR decodes inner complementary address signals ax0 and ax1 of two bits, and forms four word line selection timing signals $\phi_x 00$ through $\phi_x 11$ from word line selection timing signal $\phi_x$ through a switch circuit comprising transmission gate MOSFETs and cut MOSFETs selected by decode signals formed by the decode in similar manner to the above description. These word line selection timing signals $\phi_x 00 \sim \phi_x 11$ are transmitted through the transmission gate MOSFETs Q24~Q27 to each word line. Thereby, for example, timing signal $\phi_x 00$ of high level is transmitted to a word line W0, and the word line W0 is selected. Storage information of memory cells respectively coupled with the selected word line is transmitted to corresponding data line, and amplified by a sense amplifier. A pair of complementary data lines are selected among a plurality of complementary data line pairs by a column switch and a column decoder as hereinafter described, and coupled with a common data line. Thereby information of a required memory cell is read on the common data line.

The row decoder is divided in two such as the predecoder PDCR and the decoder UDCR, thereby pitch of the unit row decoder UDCR can be matched with pitch (interval) of the word line. As a result, a useless space is not produced on the semiconductor substrate. MOSFETs Q20~Q23 are installed between each word line and the ground potential Vss, and output of the NAND circuit is applied to gate of the MOSFETs thereby the word line at non-selective state is fixed to the ground potential. Although not particularly limited, the word line is provided at remote end side (end rn reverse side to decoder side) with MOSFETs Q1~Q4 for reset, and these MOSFETs Q1~Q4 are turned on in response to reset pulse $\phi pw$. Thereby when the word line is reset, the selected word line is reset from both ends to the ground level (non-selective potential of the word line).

The column switch CW0 (CW1~CW3) as in MOSFETs Q42, Q43 shown as representative, selectively couples the the complementary data lines D, $\overline{D}$ with the common complementary data lines CD, $\overline{CD}$. Selection signal from the column decoder C-DCR1 is supplied to gate of these MOSFETs Q42, Q43.

A precharge MOSFET Q44 to constitute a precharge circuit in similar manner to the above description is installed between the common complementary data lines CD, $\overline{CD}$.

In half precharge system, since a pair of complementary data lines in floating state are short-circuited simply, at a non-selective memory mat in a long cycle such as page mode and RAM set in non-selective state for a long time, level of the complementary data lines is deteriorated due to drain leak current or the like of the address selecting MOSFET coupled with the complementary data lines. Consequently, in the embodiment, for the level compensation, half voltage VG formed by an intermediate voltage generating circuit as hereinafter described is utilized. That is, the half voltage VG is supplied to one common source line NS in each unit circuit USA through a switch MOSFET Q51. A switch MOSFET Q50 is installed between the common source line NS and one data line $\overline{D}$. These switch MOSFETs Q50, Q51 are supplied at gate thereof with the precharge signal $\phi$pc thereby turned on during the precharge period only. In this constitution, in the chip non-selective period (precharge period), the voltage VG is supplied through the switch MOSFETs Q50, Q51 to the data line $\overline{D}$. Since the data line $\overline{D}$ is connected to other data line D by the precharge MOSFET Q5 then, variation of the precharge voltage of both data lines $\overline{D}$, D due to leak current or the like can be compensated. In addition, a switch MOSFET Q49 having gate supplied with the precharge signal $\phi$pc is installed between the common source lines NS and PS, thereby the common source lines NS and PS of the sense amplifier SA are made half precharge potential during the precharge period in similar manner to the precharge operation of the complementary data lines D, $\overline{D}$.

FIG. 1 shows an embodiment of precharge control signal generating circuits P0~P3 included in the timing generating circuit R-TG.

Although not particularly limited, the precharge control signal generating circuits P0~P3 have similar constitution to each other. Consequently, in FIG. 1, a concrete circuit diagram is shown regarding the precharge control signal generating circuit P0. Concrete description will now be performed using the precharge control signal generating circuit P0.

In the embodiment, in order to make the precharge control signal $\phi$pc half level as above described, following voltage generating circuit is installed. Between the power source voltage Vcc and the voltage dividing point (vcc/2), P-channel MOSFET Q52 and N-channel MOSFET Q53 with its drain and gate commonly connected in diode form are connected in series to each other. Between the voltage dividing point (Vcc/2) and the ground potential Vss of the circuit, P-channel MOSFET Q54 with its gate and drain commonly connected in diode form and N-channel MOSFET Q55 are connected in series to each other. Although not particularly limited, the P-channel MOSFET Q52 and the N-channel MOSFET Q55 act as resistance means since gates thereof are connected to the voltage dividing point Vcc/2. In these MOSFETs Q52 and Q55, conductance thereof is set small thereby current value of DC current flowing there can be set small.

Commonly connected gate and drain of the N-channel MOSFET Q53 in diode form are connected to gate of N-channel output MOSFET Q56. Commonly connected gate and drain of the P-channel MOSFET Q54 in diode form are connected to gate of P-channel output MOSFET Q57. In these output MOSFETs Q56 and Q57, respective drains are connected to the power source voltage Vcc and the ground potential $V_{ss}$ of the circuit, and sources thereof are commonly connected and transmit the half voltage VG of about Vcc/2.

In order to prevent flowing of DC (penetrating) current through both output MOSFETs Q56 and Q57, in other words, in order to prevent state that both MOSFETs Q56, Q57 are turned on simultaneously by the dividing voltage Vcc/2, threshold voltage Vthnl of the MOSFET Q53 is set smaller than threshold voltage Vthn2 of corresponding output MOSFET Q56 in absolute value, and threshold voltage Vthpl of the MOSFET Q54 is set smaller than threshold voltage vthp2 of corresponding output MOSFET Q57 in absolute value.

In this constitution, for example, when the output voltage VG is Vcc/2, source potential of the output MOSFET Q56 is made Vcc/2. On the contrary, gate voltage thereof is set to voltage where the dividing voltage of Vcc/2 is level-shifted higher than the threshold voltage of the MOSFET Q53 in diode form, i.e., Vcc/2+Vthnl. In this state, between gate and source of the MOSFET Q56 is supplied the threshold voltage Vthnl of the MOSFET Q53 being smaller than the threshold voltage Vthn2 of the MOSFET Q56, thereby the MOSFET Q56 is turned off. This is similar also in the P-channel output MOSFET Q57. Thereby since both output MOSFETs Q56 and Q57 are turned off together, DC current does not flow through both MOSFETs Q56, Q57.

For example, when the power source voltage Vcc rises and therefore the voltage VG is decreased relatively with respect to the gate voltage (Vcc/2+Vthnl) of the output MOSFET Q56 and difference voltage between the voltage VG and the gate voltage of the MOSFET Q56 is made larger than Vthn2, the MOSFET Q56 is turned on and the output voltage VG rises to Vcc/2+Vthnl - Vthn2. When the power source voltage Vcc rises, the gate voltage (Vcc/2 - Vthpl) of the P-channel output MOSFET Q57 rises and therefore reverse bias is further applied between gate and source thereof. As a result, the P-channel MOSFET Q57 maintains OFF-state.

On the contrary, when the power source voltage Vcc drops, the voltage VG is made higher relatively with respect to the gate voltage (Vcc/2 - Vthpl) of the output MOSFET Q57. If difference voltage between the voltage VG and the gate voltage of the MOSFET Q57 is made larger than Vthp2, the MOSFET Q57 is turned on and therefore the output voltage VG drops to Vcc/2 - Vthpl+Vthp2. When the power source voltage Vcc drops, the gate voltage (Vcc/2+Vthnl) of the N-channel output MOSFET Q56 drops and therefore reverse bias is further applied between gate and source thereof. As a result, the N-channel MOSFET Q56 maintains OFF-state.

When the power source voltage Vcc is constant and the voltage VG varies, as clearly understood from the above description, if the variation with respect to the dividing voltage Vcc/2 exceeds respective differences between the threshold voltages Vthnl and Vthn2 of corresponding MOSFETs Q53 and Q56 and between the threshold voltages Vthpl and Vthp2 of corresponding MOSFETs Q54 and Q57, the output MOSFET Q56 or Q57 is turned on thereby the level variation is compensated. Thus the voltage generating circuit acts as the stabilizing power source so that the output voltage VG becomes level of about Vcc/2. Both output MOSFETs Q56 and Q57 are not turned on simultaneously, and the operation current becomes output current entirely. Accordingly, conductance of the output MOSFETs Q56 and Q57 is set large and therefore the output current can be made large. In other words, the output impedance can be made small.

In the embodiment, an output terminal of the voltage generating circuit is connected through a switch MOS- FET Q58 to an output terminal of precharge control signal (precharge control signal line) $\phi pc^0$ ($\phi pc^1 \sim \phi pc^3$). Output MOSFETs Q59 and Q60 in push-pull form are installed between the output terminal and the power source voltage Vcc and the ground potential point of the circuit. Output signals of NOR gate circuits G1 and G2 are supplied to gates of the output MOSFETs Q59 and Q60. Timing signal $\phi$ is supplied to one input of these NOR gate circuits G1 and G2. A decoder circuit DEC receives row series inner complementary address signal axi-1 and address signal axi to assign a required memory mat among the memory mats M0~M3 and decodes them thereby forms control signal PC0 (PC1~PC3). The decoder circuit DEC at chip non-selective state makes the output signal PC0 (PC1-PC3) high level. When the memory access is started, the decoder circuit DEC decodes the row series inner complementary address signals axi-1 and axi, thereby selected one among the output signals PC0-PC3 is made low level and residual output signals are held to high level. The control signal PCO is supplied to other input of the NOR gate circuit G2. Also the control signal PCO is supplied through an inverter circuit IV2 to other input of the NOR gate circuit G1. Although not particularly limited, the timing signal $\phi$ is formed in a circuit (not shown) which is also a part of the row timing generator R-TG. The timing signal $\phi$ is based on outer address strobe signal $\overline{RAS}$ and the timing signal $\phi_{rd}$. That is, the timing signal $\phi$ varies to high level in response to variation of the signal $\overline{RAS}$ to low level, and varies to low level in synchronization with generation of the timing signal $\phi_{rd}$. Thereby the timing signal $\phi$ is made high level when access of the dynamic type RAM is started, in other words, at timing of variation of the row address strobe signal $\overline{RAS}$ from high level to low level. Also the timing signal $\phi$ is made low level at timing that row series inner address signals respectively are established to potential to indicate required memory cells from the memory array in the dynamic type RAM.

As noted above, in addition to including circuitry such as shown in FIG. 1, the row timing generator R-TG also includes a circuit (not shown) for generating the timing signal $\phi$. Further, the row timing generator also includes circuitry (not shown) for generating the timing signals $\phi_{rd}$, $\phi_x$ and $\phi_{pa0}-\phi_{pa3}$. These unshown circuits are designed in accordance with well-known circuit principles to perform the timing operations discussed herein.

Operation of the embodiment will now be described referring to timing charges shown in FIG. 2(A) - FIG. 2(f).

At chip non-selective state where the signal $\overline{RAS}$ is made high level, the timing signal $\phi$ is made low level. Thereby the MOSFET Q58 is turned off. At low level of the timing signal $\phi$ and high level of the output signal PC0 of the decoder circuit DEC, output signal of the NOR gate circuit G1 becomes high level and the output MOSFET Q59 is turned on. Thereby since the precharge control signal $\phi_{pc}$ ($\phi pc^0 \sim \phi pc^3$) is made high level, the precharge MOSFETs Q5, Q49 and the like shown in FIG. 4 are turned on and the above-mentioned precharge operation is performed.

When the signal RAS is converted from high level into low level and therefore the memory access is started, the timing signal $\phi$ is made high level. Thereby respective output signals of the NOR gate circuits G1 and G2 become low level, and the output MOSFETs Q59 and Q60 are turned off. Then the switch MOSFET Q58 is turned on by the timing signal $\phi$. Thereby the precharge control signal $\phi pc$ ($\phi pc^0 \sim \phi pc^3$) is lowered from high level into half voltage (Vcc/2) such as the voltage VG. Since the complementary data line pairs respectively are at half level, the precharge MOSFET Q5 or the like is turned off.

When potential of the row series inner address signal is established, the timing signal $\phi$ is made low level. Thereby the switch MOSFET Q58 is converted from ON-state into OFF-state. For example, when the row series inner address signals axi-1, axi respectively are established to low level, the memory mat M0 is assigned the decoder DEC converts only the control signal PC0 from high level into low level and maintains residual control signals PC1~PC3 to high level. Thereby in the precharge signal generating circuit P0 corresponding to the selected memory mat M0, output signal of the NOR gate circuit G2 is made high level due to low level of the control signal PC0. On account of high level of the NOR gate circuit G2, the output MOSFET Q60 is turned on and the precharge control signal $\phi pc^0$ is converted from the half level into low level. Also in the precharge signal generating circuits P1~P3 corresponding to the memory mats M1~M3 at non-selective state, output signal of the NOR gate circuit G1 is made high level due to high level of the control signals PC1~PC3. On account of high level of the NOR gate circuit G1, the output MOSFET Q59 in respective precharge control circuits P1~P3 is turned on and the precharge control signals $\phi pc^1 \sim \phi pc^3$ are converted from the half level into high level as shown by dotted line in the figure. In this constitution, in respective memory mats at non-selective state, the precharge MOSFET Q5 or the like is turned on, thereby level between the complementary data lines is made coincident and level drop of the data lines due to drain leak current is compensated. Thus level variation of the precharge signal is reduced to ½ in the signal amplitude in comparison to the prior art, thereby the low consumption power in the precharge operation can be realized.

Also in the embodiment, since the precharge MOSFETs are substantially turned off by the half voltage, when potential of the row series inner address signal is established, the word line selection timing signal $\phi_x$ can be immediately generated and selection operation of the word line (W) can be performed. Thereby the selection timing of the word line can be made early without waiting the drawing time of the precharge control signal $\phi_{pc}$ to low level or the time margin in consideration of the process variation. In this case, the memory cycle can be decreased and therefore the high speed operation can be realized.

After the selection operation of the word line, the timing signal $\phi pa$ ($\phi p1$, $\phi p2$) is generated, and the amplifying operation of the storage information read from the memory cell is started in the selected memory mat.

In addition, if the signal $\overline{CAS}$ is converted from high level into low level, selection operation of column series is started. Since the selection operation of the column series has no direct relation to the invention, the description shall be omitted.

Figure 5:
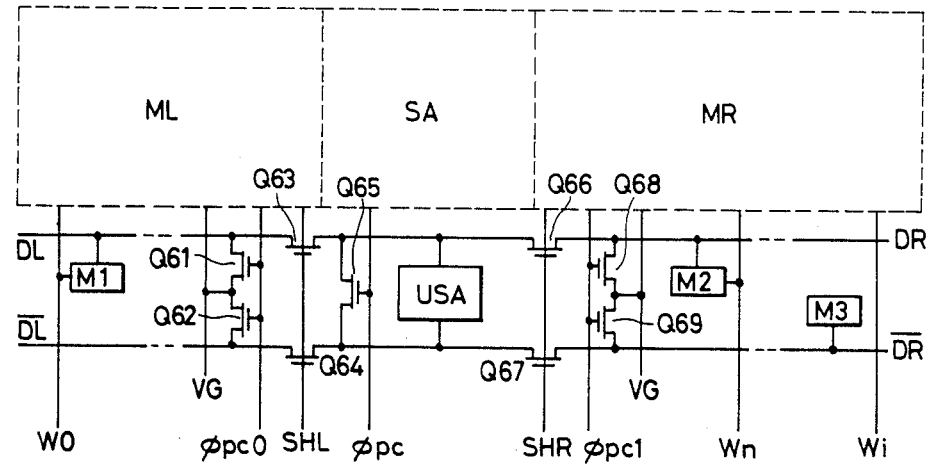
FIG. 5 is a circuit diagram illustrating a second embodiment of the invention.

FIG. 5 shows a circuit diagram of main part of a second embodiment of the invention. A dynamic type RAM shown in FIG. 5 is RAM of shared sense system. Since it is of shared sense system, a sense amplifier SA is used commonly to a memory mat ML and a memory mat MR. The sense amplifier SA and the memory mats ML, MR have a plurality of memory cell rows in similar constitution to each other. Consequently in FIG. 5, only one memory cell row is concretely shown as representative.

In FIG. 5, M1~M3 respectively designate memory cells each composed of an address selecting Qm and an information storing capacitor $C_s$ in similar manner to the preceding embodiment. USA designates a unit sense amplifier having similar circuit constitution to the USA shown in FIG. 4. In FIG. 5, in order to simplify the description, the common source lines NS, PS and the MOSFETs Q10~Q13 to control operation of the sense amplifiers all shown in FIG. 4 shall not be shown. Also the column switch and the common data line shall not be shown.

In FIG. 5, SHL and SHR respectively designate selection signals to select memory mats, which are made high level at chip non-selective state. When the memory mat ML is selected, the memory mat selection signal SHL is maintained to high level and the selection signal SHR is made low level. On the contrary, when the memory mat MR is selected, the selection signal SHR is maintained to high level and the selection signal SHL is made low level.

The complementary data lines (e.g., DL, $\overline{DL}$) in the selected memory mat (e.g, ML) are coupled through selecting MOSFETs Q63, Q64 with the unit sense amplifier USA. Consequently, when a word line W0 is selected in the selected memory mat ML, storage information of the memory cell M1 coupled with the word line W0 is transmitted to the unit sense amplifier USA, and amplified and then transmitted to a column switch (not shown). When the memory cell rows (DL, $\overline{DL}$, DR, $\overline{DR}$) are selected by a column decoder (not shown), information of the memory cell M1 is amplified by the unit sense amplifier USA, and then read through the column switch in a common data line (not shown).

In the embodiment, between the complementary data lines DL, $\overline{DL}$ and the voltage line to which the half voltage VG is supplied, precharge MOSFETs Q61, Q62 with source-drain path connected thereto are installed. Precharge control signal $\phi pc^0$ formed by the circuit shown in FIG. 1 is supplied to gates of these MOSFETs Q61, Q62 through the precharge control line. Also between the complementary data lines DR, $\overline{DR}$ and the voltage line to which the half voltage VG is supplied, precharge MOSFETs Q68, Q69 with source-drain path connected thereto are installed. Precharge control signal $\phi pc^1$ shown in the preceding embodiment is supplied to gates of these MOSFETs Q68, Q69 through the precharge control line. As clearly understood from the preceding embodiment shown in FIG. 1, the precharge control signals $\phi pc^0$, $\phi pc^1$ are made high level at chip non-selective state. Consequently, each of the complementary data lines DL, $\overline{DL}$, DR, $\overline{DR}$ is half-precharged by the half voltage VG. Also when the row address strobe signal $\overline{RAS}$ is varied from high level into low level and the chip is selected, the precharge signals $\phi pc^0$, $\phi pc^1$ are respectively made half level, thereby the precharge MOSFETs Q61, Q62, Q68, Q69 are substantially turned off. For example, when the word line (e.g., W0) in the memory mat ML is selected, the precharge signal $\phi pc^0$ is made low level before the word line is selected, and the precharge signal $\phi pc^1$ is made high level. Thereby the half voltage is again supplied to the complementary data lines DR, $\overline{DR}$ in the memory mat MR through the precharge MOSFETs Q68, Q69. On the other hand, in the memory mat ML, the word line W0 is selected thereby storage information of the memory cell M1 is transmitted to the data line DL. The unit sense amplifier USA receives information of the memory cell M1 at one input/output node through the MOSFET Q63 and receives precharged half voltage previously at other input/output node, and then amplifies the difference voltage.

MOSFET Q65 shown in FIG. 5 receives the precharge signal $\phi pc$ on its gate, and short-circuits between a pair of input/output nodes of the sense amplifier so as to balance the potential, and also acts so that respective potentials of the data lines DL, $\overline{DL}$, DR, $\overline{DR}$ become the half voltage VG.

Although not particularly limited, the precharge signal $\phi pc$ can be formed by an AND gate circuit which receives the precharge signals $\phi pc^0$ and $\phi pc^1$. In this case, the precharge signal $\phi pc$ becomes high level at chip non-selective state, and becomes low level when any memory mat is selected.

Figure 6:
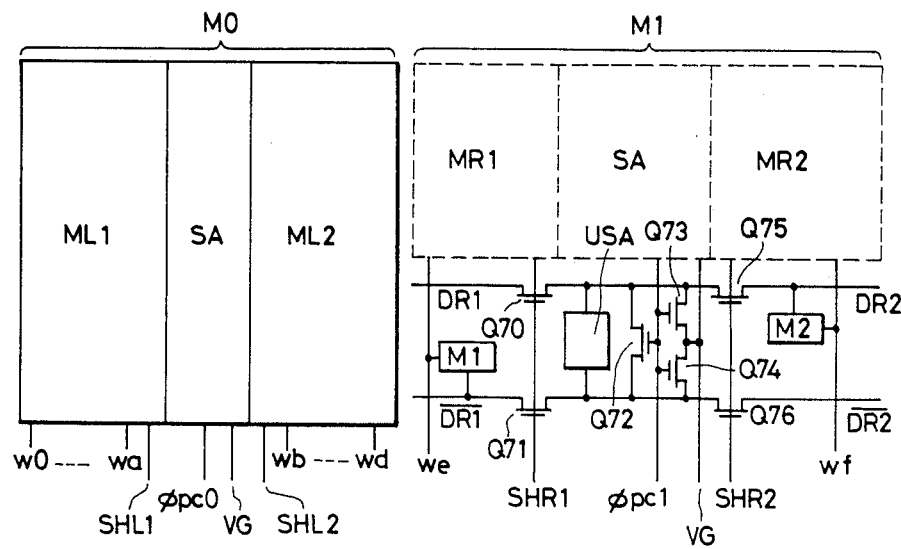
FIG. 6 is a circuit diagram illustrating a third embodiment of the invention.

FIG. 6 shows a circuit diagram of main part of a third embodiment of the invention. A dynamic type RAM of the embodiment is also a dynamic type RAM of shared sense system similar to the second embodiment.

In FIG. 6, M0 and M1 respectively designate memory mats each composed of a plurality of memory blocks and a sense amplifier group. Each of the memory blocks ML1, ML2, MR1, MR2 and the sense amplifier group SA are constituted by a plurality of memory cell rows in similar constitution to each other. Consequently in FIG. 6, only one memory cell row is concretely shown.

In FIG. 6, SHL1, SHL2, SHR1 and SHR2 respectively designate memory block selection signals, which are made low level at non-selective state of corresponding memory block and made high level at selective state thereof. M1 and M2 designate memory cells having similar constitution to that described in the second embodiment. Also USA designates a unit sense amplifier circuit having similar constitution to the USA shown in the second embodiment.

MOSFETs Q70, Q71, Q75, Q76 respectively are memory block selecting MOSFETs. For example, when the memory block MR1 is selected, the selection signal SHR1 corresponding to this is made high level. Thereby the MOSFETs Q70, Q71 are turned on, and according to selection of a word line We, storage information of the memory cell M1 is transmitted to one input/output node of the unit sense amplifier USA and amplified and then transmitted through a column switch (not shown) to a common data line (not shown).

In the embodiment, MOSFETs Q72~Q74 are precharge MOSFETs, and VG designates a voltage signal line to which the half voltage VG is supplied. Also $\phi pc^0$, $\phi pc^1$ respectively designate precharge control signals formed by the circuit shown in FIG. 1.

The block selection signals SHL1, SHL2, SHR1, SHR2 respectively are made high level at chip non-selective state. Also as described using FIG. 1, the precharge signals $\phi pc^0$, $\phi pc^1$ respectively are made high level at chip non-selective state. Thereby the complementary data lines DR1, $\overline{DR1}$, DR2, $\overline{DR2}$ are half-precharged respectively.

At chip selective state, the precharge signals $\phi pc^0$, $\phi pc^1$ respectively are made half level. And then, for example, if the word line We or Wf is selected, the precharge signal $\phi pc^1$ is converted from half level into low level before the word line is selected. As a result, storage information of the memory cell M1 or M2 is amplified by the sense amplifier USA. On the other hand, regarding the memory blocks ML1, ML2 then, since the memory block selection signals SHL1, SHL2 are at high level and the precharge signal $\phi pc^0$ is converted from half level into high level, the complementary data lines in the memory blocks ML1, ML2 are respectively precharged to half level.

In the second and third embodiments, although not particularly limited, when the word line is selected, one among the word lines Wo~Wi (or Wo~Wf) is selected. Also as clear from FIG. 5 and FIG. 6, the dynamic type RAM in the second and third embodiments is of system of two points of intersection. Further in the second and third embodiments, since the two precharge signals $\phi pc^0$, $\phi pc^1$ are used, the decoder DEC in FIG. 1 is not substantially required thereby high integration can be realized.

Figure 8:
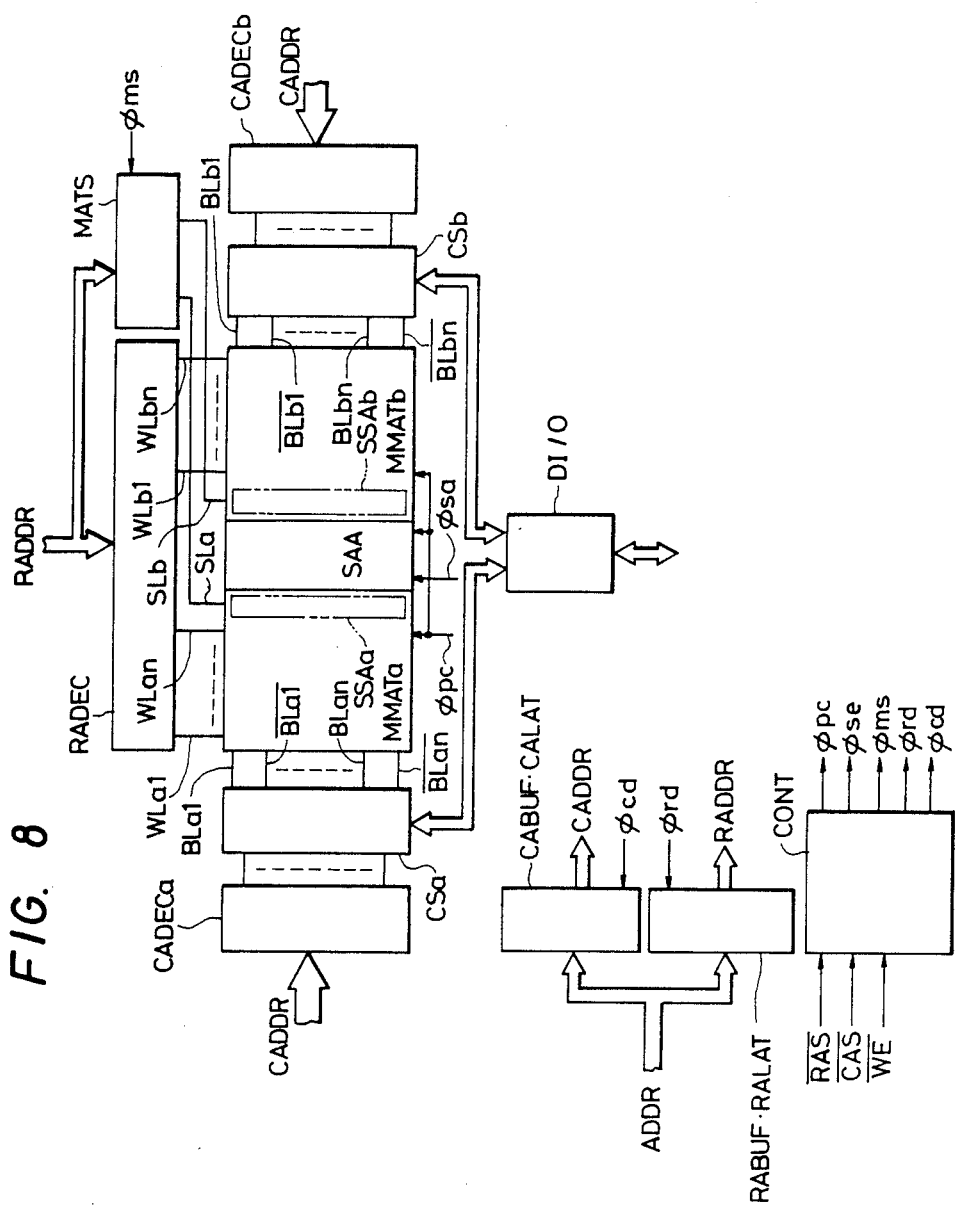
FIG. 8 is a block diagram illustrating an example of a dynamic type RAM of shared sense system.

FIG. 8 shows a block diagram illustrating the whole of a dynamic type RAM (hereinafter referred to as DRAM) of shared sense system as a fourth embodiment of a semiconductor memory according to the invention. Although not particularly limited, the DRAM shown in FIG. 8 is formed on one semiconductor substrate by known manufacturing technology of semiconductor integrated circuit.

At first, outline of the DRAM of the embodiment will be described referring to FIG. 8.

The DRAM of the embodiment is provided with memory mats MMATa, MMATb comprising a plurality of dynamic type memory cells (refer to MC in FIG. 7) in matrix arrangement disposed at lateral sides of a sense amplifier column SAA. Since it is of shared sense system, the sense amplifier column SAA is commonly used for the memory mats MMATa, MMATb on both sides. Consequently, as hereinafter described in detail referring to FIG. 7, a plurality of complementary data line pairs BLa1, $\overline{BLa1}$~BLan, $\overline{BLan}$ in the memory mat MMATa are coupled through a sharing MOSFET (refer to MOSFET Q1a in FIG. 7) included in a sharing switch column SSAa with an input/output terminal of a unit sense amplifier circuit (refer to SA in FIG. 7) included in the sense amplifier column SAA. Also a plurality of complementary data line pairs BLb1, $\overline{BLb1}$~BLbn, $\overline{BLbn}$ in the memory mat MMATb are coupled through a sharing MOSFET (refer to MOSFET Q1b in FIG. 7) included in a sharing switch column SSAb with an input/output terminal of a unit sense amplifier circuit included in the sense amplifier column SAA.

Gate electrode of each sharing MOSFET included in the sharing switch column SSAa is commonly connected to a sharing signal line SLa, and also gate electrode of each sharing MOSFET included in the sharing switch column SSAb is commonly connected to a sharing signal line SLb. Although not particularly limited, the sharing signal lines SLa, SLb are finally established to complementary level based on output selection signal of a mat selecting circuit MATS which determines selection/non-selection of a memory mat based on a prescribed bit within row series address signals RADDR (prescribed row series address signal). Level control of the sharing signal lines SLa, SLb will be hereinafter described in detail.

In the memory mat MMATa, among the memory cells in matrix arrangement, selection terminals of memory cells disposed on the same column are connected to the same word line. That is, they are coupled with word lines WLa1~WLan being different from each other per memory cell column. Also in the memory mat MMATb, among the memory cells in matrix arrangement, selection terminals of memory cells disposed on the same column are connected to the same word line. That is, they are coupled with word lines WLb1~WLbn being different from each other per memory cell column. Although not particularly limited, the word lines WLa1 - WLan, WLb1 - WLbn receive the row series inner complementary address signals RADDR, and prescribed one among the plurality of word lines is made selection level based on output selection signal of a row address decoder RADEC to decode the signals RADDR. Although not particularly limited, the selection level of the word line is set to level in bootstrap beyond the power source voltage Vcc, and non-selective level of the word line is set to level of the ground potential Vss of the circuit.

Now, an example of one sense amplifier drive system according to the complementary data line pairs BLa1, $\overline{BLa1}$, BLb1, $\overline{BLb1}$ will be described in detail referring to FIG. 7.

The complementary data line pairs BLa1, $\overline{BLa1}$, BLb1, $\overline{BLb1}$ are coupled with each other through N-channel sharing MOSFETs Q1a, Q1b included in the sharing switch columns SSAa, SSAb, and a unit sense amplifier circuit SA and a precharge circuit PCs are coupled between these sharing MOSFETs Q1a and Q1b. The complementary data line pair BLa1, $\overline{BLa1}$ included in the memory mat MMATa is disposed to the left of the sharing MOSFET Q1a, and the precharge circuit PCa and further a plurality of memory cells MC are coupled with these members regularly. Also the complementary data line pair BLb1, $\overline{BLb1}$ included in the memory mat MMATb is disposed to the right of the sharing MOSFET Q1b, and the precharge circuit PCb and further a plurality of memory cells MC are coupled with these members regularly.

Although not particularly limited, the memory cell MC is made one transistor type comprising N-channel type selecting MOSFET Q2 and a storage capacitor Cs connected in series, and its data input/output terminal is coupled with a prescribed complementary data line and its selection terminal is coupled with a prescribed word line. Although not particularly limited, the storage capacitor Cs of each memory cell MC is supplied with plate potential Vpl corresponding to half of one power source voltage Vcc of the circuit.

Although not particularly limited, the sense amplifier SA is made static type constituted by P-channel type sense amplifier section SAp and N-channel type sense amplifier section SAn. The N-channel type sense amplifier section SAn includes N-channel type MOSFETs Q3, Q4 with source electrodes commonly connected, and drain electrode of the MOSFET Q3 and gate electrode of the MOSFET Q4 are coupled with the complementary data lines BLa1, BLb1, and further drain electrode of the MOSFET Q4 and gate electrode of the MOSFET Q3 are coupled with the complementary data lines $\overline{BLa1}$, $\overline{BLb1}$. Also the P-channel type sense amplifier section SAp includes P-channel type MOSFETs Q5, Q6 with source electrodes commonly connected, and drain electrode of the MOSFET Q5 and gate electrode of the MOSFET Q6 are coupled with the complementary data lines BLa1, BLb1, and further drain electrode of the MOSFET Q6 and gate electrode of the MOSFET Q5 are coupled with the complementary data lines $\overline{BLa1}$, $\overline{BLb1}$.

One power source voltage Vss such as the ground potential of the circuit can be applied to the common source electrode of the N-channel type sense amplifier section SAn through N-channel type power switch MOSFET Q7, and other power source voltage Vcc of the circuit can be applied to the common source electrode of the P-channel type sense amplifier section SAp through P-channel type power switch MOSFET Q8. The power switch MOSFETs Q7, Q8 are switch-controlled by sense amplifier drive signal sa.

The precharge circuits PCs, PCa, PCb have similar circuit constitution to each other, and although not particularly limited, each precharge circuit includes N-channel type equalizer MOSFETs Q9, Q10 which short-circuit the complementary data line pair by ON-operation at prescribed timing of the chip non-selective period, and balance the complementary data line pair to the intermediate level Vcc/2 between the power source voltage Vcc and the ground potential Vss of the circuit. Further, coupling node of the equalizer MOSFETs Q9, Q10 is supplied with voltage Vcc/2 (VG) which prevents variation of potential of the complementary data lines due to leak current or the like and compensates the precharge level. Each of the equalizer MOSFETs Q9 and Q10 is switch-controlled by precharge signal $\phi$pc so that it is controlled to high level during the chip non-selective period. In the embodiment, although not particularly limited, all equalizer MOSFETs are controlled to OFF-state until the selection timing where the word lines are selected. The precharge circuits PCs, PCa, PCb precharge the complementary data line pair and the input/output node of the unit sense amplifier circuit SA previously to required level for the operation before starting the memory access, and the level of the precharged complementary data lines is used as discrimination level in the unit sense amplifier circuit SA when data stored in the memory cell are read.

Figure 7:
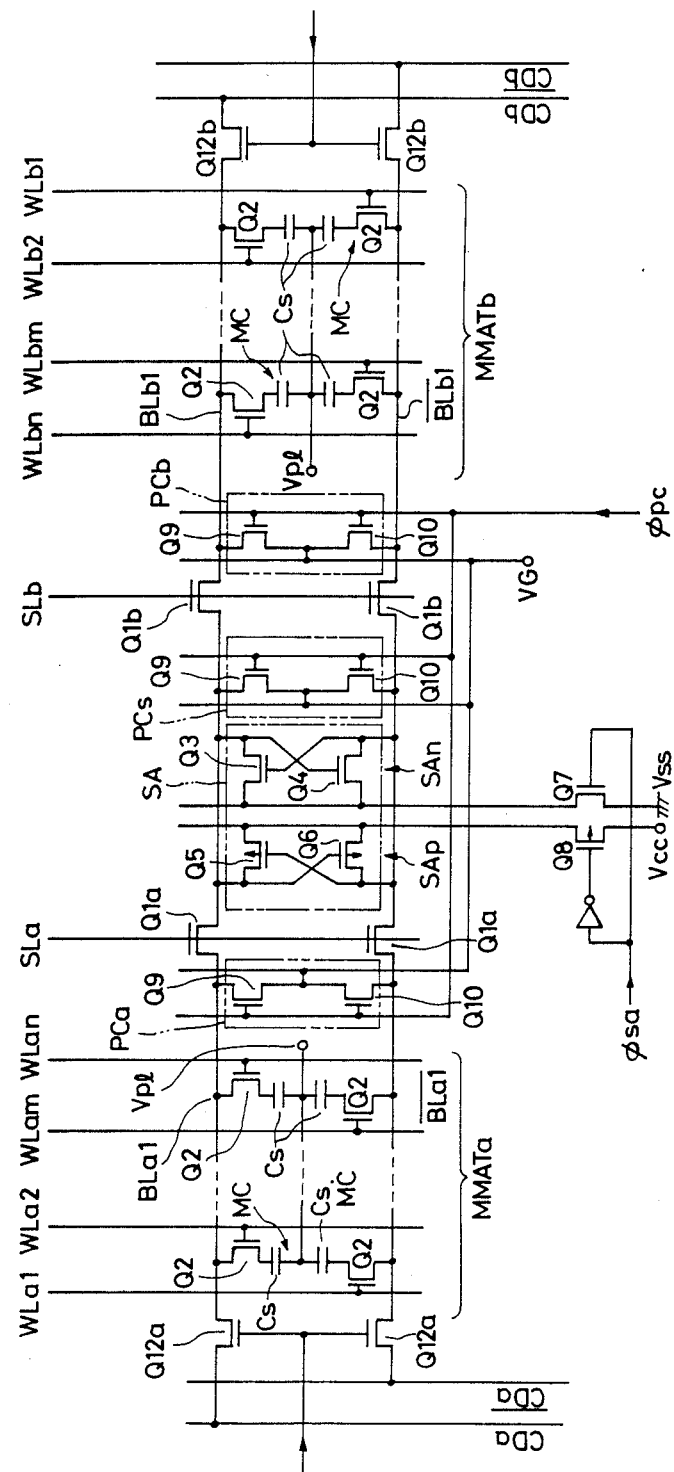
FIG. 7 is a circuit diagram illustrating a fourth embodiment of the invention.

The sense amplifier drive system for other complementary data line pairs also is constituted similarly to the sense amplifier drive system shown in FIG. 7.

Each of the complementary data line pairs BLal, $\overline{BLal}$~BLan, $\overline{BLan}$ to constitute the sense amplifier drive system as shown in FIG. 8 is connected through a column selecting MOSFET (refer to MOSFET Q12a in FIG. 7) included in the column switch circuit CSa to common data lines (refer to CDa, $\overline{CDa}$ in FIG. 7) commonly, and the common data lines are connected to a data input/output circuit DI/0. Also the bit line pairs BLbl, $\overline{BLbl}$~BLbn, $\overline{BLbn}$ are connected through a column selecting MOSFET (refer to MOSFET Q12b in FIG. 7) included in the column switch circuit CSb to common data lines (refer to CDb, $\overline{CDb}$ in FIG. 7) commonly, and the common data lines are connected to a data input/output circuit DI/0. The data input/output circuit DI/0 includes a main amplifier and a data input/output buffer although not shown.

Although not particularly limited, the column switch circuits CSa, CSb respectively receive column series inner complementary address signals CADDR, and are switch-operated based on output selection signals of column address decoders CADECa, CADECb to decode the signals CADDR. Thereby one set of complementary pair indicated by the column series inner complementary address signals CADDR is selected among a plurality of complementary data line pairs, and connected electrically to the common data line pair.

Although not particularly limited, row series outer address signals and column series outer address are supplied in time division from outside of the DRAM into the DRAM. In the figure of the embodiment, these outer address signals are shown as ADDR. The row series outer address signal is taken to a row address buffer and row address latch RABUF.RALAT in synchronization with timing signal $\phi$rd formed by variation of the row address strobe signal $\overline{RAS}$ from high level into low level. Also the column series outer address signal is taken to a column address buffer and column address latch CABUF.CALAT in synchronization with timing signal $\phi$cd formed by variation of the column address strobe signal $\overline{CAS}$ from high level into low level.

The row address buffer and row address latch RABUF.RALAT forms inner complementary address signal RADDR in response to taken outer address signal in similar manner to the row address buffer R-ADB described using FIG. 3, and supplies the signal RADDR to each circuit. Also the column address buffer and column address latch CABUF.CALAT forms inner complementary address signal CADDR in response to taken outer address signal, and supplies the signal CADDR to each circuit.

Although not particularly limited, a timing controller CONT to perform inner control of the DRAM is supplied with $\overline{RAS}$ (row address strobe) signal, $\overline{CAS}$ (column address strobe) signal and $\overline{WE}$ (write enable) signal from outside, and forms various timing signals. The $\overline{RAS}$ signal indicates chip selective state by its low level, and indicates taking of row series outer address signal. The $\overline{CAS}$ signal indicates taking of column series outer address signal by its low level. The $\overline{WE}$ signal indicates data write operation by its low level, and indicates data read operation by its high level. The timing controller CONT forms various timing signals to perform reset for a necessary circuit block such as an address decoder and precharge of the complementary data line pair and further precharge of the sharing signal lines SLa, SLb at the chip non-selective state where the signal $\overline{RAS}$ is made high level. Also the timing controller CONT forms various timing signals to activate each circuit block such as an address latch or a sense amplifier according to prescribed procedure and to control selection timing by the row address decoder RADEC or the mat selecting circuit MATS at the chip selective state where the signal $\overline{RAS}$ is made low level. Particularly in FIG. 8, drive signal $\phi$sa to activate the sense amplifier, precharge signal $\phi$pc for the complementary data lines, control signal $\phi$ms for the mat selecting circuit MATS and the above-mentioned timing signals $\phi$cd, $\phi$rd are shown as representative.

Next, control procedure for the precharge circuits PCs, PCa, PCb, the mat selecting circuit MATS and the unit sense amplifier circuit SA or the like will be described mainly regarding level control of the sharing signal lines SLa, SLb.

The control signal $\phi$ms is controlled to high level at the chip non-selective state where the row address strobe signal $\overline{RAS}$ is made high level. Thereby the mat selecting circuit MATS precharges the pair of sharing signal lines SLa, SLb to voltage Vcc/2 (VG) being nearly equal to the precharge level of the complementary data lines. In such chip non-selective state, the precharge signal $\phi$pc also is controlled to high level. Thereby each complementary data line pair is precharged to prescribed voltage Vcc/2 by action of each of the precharge circuits PCs, PCa, PCb irrespective of the switch state of the sharing MOSFETs Qla, Qlb.

When the complementary data lines and the sharing signal lines SLa, SLb are precharged to voltage Vcc/2, since voltage between gate and source of the sharing MOSFETs Q1a, Q1b does not attain to prescribed threshold voltage, the MOSFETs Q1a, Q1b are at OFF-state. That is, the bit line pair at side of the memory mat MMATa and the bit line pair at side of the memory mat MMATb are held non-conductive electrically to each other.

When the signal $\overline{RAS}$ is varied to low level and made the chip selective state, in the embodiment, although not particularly limited thereto, the precharge signal $\phi pc$ is varied to low level in synchronization with this. Thereby the conductive state between the complementary data line pair by the equalizer MOSFETs Q9, Q10 is interrupted. In this state, if prescribed one word line is driven to the selective level, the complementary data line pair at side of the memory mat MMATa and the complementary data line pair at side of the memory mat MMATb are held non-conductive electrically by action of the sharing MOSFETs Q1a, Q1b being at OFF-state already as above described. As a result, on the complementary data lines at side of the memory mat (selective memory mat) to which the selection word lines belong, relatively small potential difference to the discrimination level (precharge level of Vcc/2) is produced according to the read signal amount from the memory cell.

In order that the small potential difference can be amplified by the unit sense amplifier circuit SA, before the MOSFETs Q7, Q8 are turned on by sense amplifier drive signal $\phi sa$ of high level and the amplifying operation of the unit sense amplifier circuit SA is started, the small potential difference must be transmitted to the input/output node of the unit sense amplifier circuit SA. Consequently, regarding the sharing MOSFETs Q1a, Q1b, at least before starting the amplifying operation of the unit sense amplifier circuit SA, complementary switch operation is started so that the sharing MOSFET installed at side of the memory mat to be selected is apt to be turned on and the MOSFET installed at side of the non-selective memory mat is maintained to OFF-state.

If the amplifying operation of the sense amplifier SA is started, according to the storage data of the memory cell, the attaining level of the complementary data lines to be made low level is made nearly equal to one power source voltage Vss to be made the common source voltage of the N-channel type sense amplifier section SAn. On the contrary, according to the storage data of the memory cell, the attaining level of the complementary data lines to be made high level is made nearly equal to other power source voltage Vcc to be made the common source voltage of the P-channel type sense amplifier section SAp. Consequently, among the sharing MOSFETs, gate voltage of the sharing MOSFET to maintain OFF-state should not be made higher than the threshold voltage of the sharing MOSFET with respect to the potential of the complementary data lines at low level side to be sequentially amplified at least.

Thus the mat selecting circuit MATS and the timing controller CONT force the sharing signal lines SLa, SLb previously to the same level as the precharge level of the complementary data lines at suitable timing before driving the prescribed word line to the selective level, and further start the complementary switch operation of the sharing MOSFETs Q1a, Q1b before starting the subsequent amplifying operation of the unit sense amplifier circuit SA. And then, before the amplifying operation of the sense amplifier SA is established, the mat selecting circuit MATS and the timing controller CONT establish ON-state of the sharing MOSFET at side of the selective memory mat and OFF-state of the sharing MOSFET at side of the non-selective memory mat.

Figure 9:
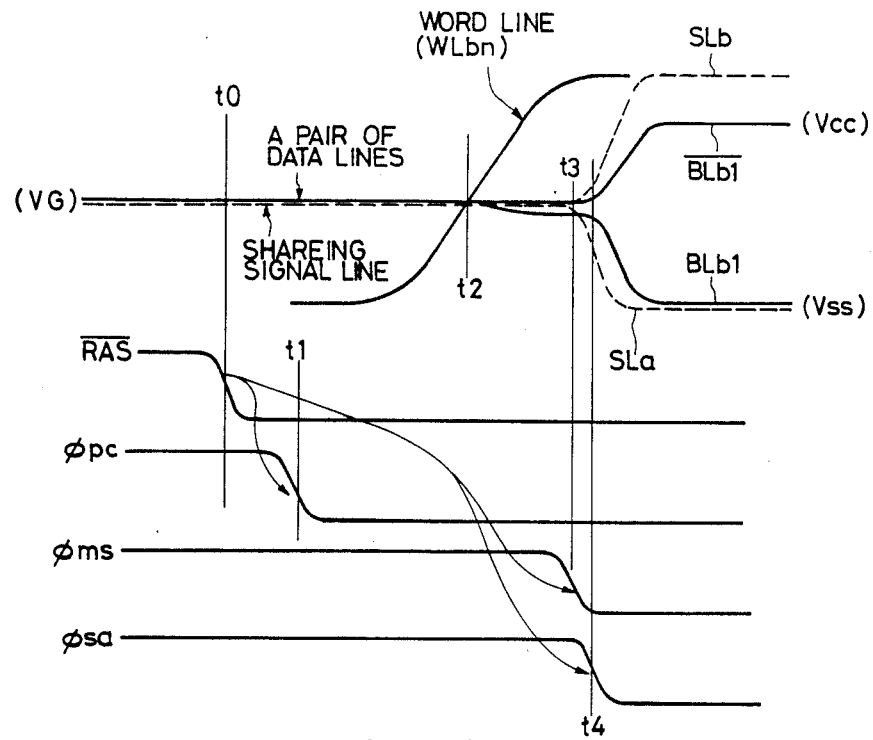
FIG. 9 is a timing chart illustrating operation of the embodiment shown in FIG. 7.

An example of such operation is shown in a time chart of FIG. 9.

That is, at the chip non-selective state where the row address strobe signal $\overline{RAS}$ is made high level, the control signal $\phi ms$ and the precharge signal $\phi pc$ are respectively made high level. In response to this, the pair of sharing signal lines SLa, SLb are respectively precharged by the mat selecting circuit MATS to voltage Vcc/2 (VG) being equal to the precharge level of the complementary lines. Also then all complementary data line pairs are precharged by action of the precharge circuits PCs, PCa, PCb to prescribed voltage Vcc/2 (VG).

Although not particularly limited, in the embodiment, since the precharge circuits PCs, PCa, PCb are respectively arranged to each of the memory mats MMATa, MMATb and the sense amplifier column SAA as shown in FIG. 7, the complementary data line pair to constitute the individual sense amplifier drive system can be precharged to prescribed level irrespective of the switch state of the sharing MOSFETs Q1a, Q1b, in other words, even if the sharing MOSFETs Q1a, Q1b are not once turned on during the precharge operation of the complementary data lines.

Thus when each of the complementary data lines and the sharing signal lines SLa, SLb are precharged, since voltage between gate and source of the sharing MOSFETs Q1a, Q1b does not attain to the prescribed threshold voltage, the MOSFETs Q1a, Q1b are at OFF-state. As a result, the complementary data line pair in the memory mat MMATa and the complementary data line pair in the memory mat MMATb are held non-conductive electrically to each other.

If the strobe signal $\overline{RAS}$ is varied to low level at the time to and made the chip selective state (DRAM selective state), in synchronization with this, the precharge signal $\phi pc$ is varied to low level at the time t1. Thereby the conductive state between the complementary data line pair by the equalizer MOSFETs Q9, Q10 is interrupted.

Next, in synchronization with variation of the strobe signal $\overline{RAS}$ to low level, prescribed word line, for example, the word line WLbn is driven to the selective level according to the row series inner complementary address signal RADDR in response to row series outer address signal taken to inside. Thereby between a plurality of complementary data line pairs in the memory mat MMATb including the selective word line, at the time t2 or later, relatively small potential difference is produced to the discrimination level (precharge level of Vcc/2) according to the read signal amount from the memory cell. FIG. 9 shows level variation of the complementary data line pair BLbl, $\overline{BLbl}$ as representative. This example shows the case that the word line WLbn is selected thereby data of the memory cell read to the complementary data lines BLbl is data of low level.

When such prescribed word line is driven to the selective level, the complementary data line pair in the memory mat MMATa and the complementary data line pair in the memory mat MMATb are held non-conductive electrically by action of the sharing MOSFETs Q1a, Q1b being at OFF-state already as above described.

As a result, parasitic capacitance coupled with the complementary data lines in the non-selective memory mat MMATa is not coupled with the complementary data lines in the selective memory mat MMATb where data of the selected memory cell is to be read. Thereby in the memory mat to which the selection word lines belong, small potential difference appearing between the complementary data lines can be enlarged and the operation margin of the DRAM can be enlarged.

In FIG. 9, although not particularly limited, start timing of the complementary switch operation of the sharing MOSFETs Qla, Qlb by the sharing signal lines SLa, SLb is shown by relatively delayed timing, and is made the timing immediately before the unit sense amplifier circuit SA starts the amplifying operation in the case that the sense amplifier drive signal $\phi$sa is made low level at the time t4. That is, if the control signal $\phi$ms is varied to low level at the time t3, the mat selecting circuit MATS drives the sharing signal line SLb in the memory mat MMATb to be selected in response to the row series inner complementary address signal RADDR supplied thereto into high level in bootstrap beyond the power source voltage Vcc, and drives the sharing signal line SLa at side of the non-selective memory mat MMATa into the power source voltage Vss.

According to level control of such sharing signal lines SLa, SLb, the complementary switch operation is started so that the sharing MOSFET Qlb in the memory mat to be selected is apt to be turned on and the sharing MOSFET Qlb in the non-selective memory mat maintains OFF-state. Thereby the small potential difference of the complementary data line pair BLbl, $\overline{BLbl}$ is transmitted to the input/output node of the sense amplifier SA. In the hereinafter timing, the amplifying operation of the sense amplifier SA is started at the time t4.

Then gate voltage of the sharing MOSFET Qla to maintain the OFF-state, i.e., level of the sharing signal line SLa is varied with respect to potential of the complementary data lines BLbl at low level side amplified by the sense amplifier SA so that it does not become higher than the threshold voltage of the sharing MOSFET Qla. On the other hand, gate voltage of the sharing MOSFET Qlb to be turned on, i.e., level of the sharing signal line SLb is varied with respect to potential of the complementary data lines $\overline{BLbl}$ at high level side amplified by the sense amplifier SA so that it becomes higher than the threshold voltage of the sharing MOSFET Qlb.

Thereby if the unit sense amplifier circuit SA starts the operation, the complementary data line pair in the memory mat MMATb to be selected is driven to the complementary level respectively in response to the storage data of the memory cell, and data of the required memory cell is read to outside according to selection operation of the column switch circuit CSb. Also in the data write, level of the sharing signal lines SLa, SLb is controlled in similar manner to the above description.

Figure 10:
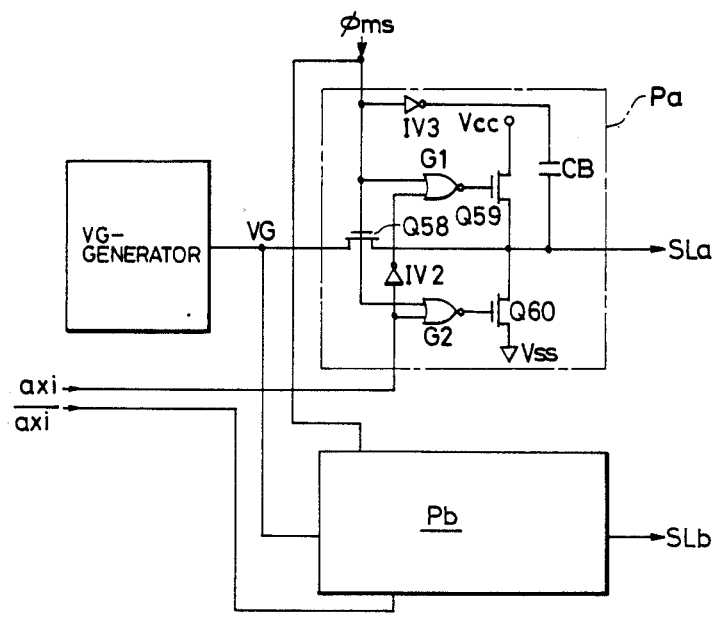
FIG. 10 is a block diagram illustrating an embodiment of a mat selecting circuit.

FIG. 10 shows an embodiment of the above-mentioned mat selecting circuit MATS. The mat selecting circuit MATS shown in FIG. 10 has similar constitution to that of the precharge control signal generating circuit described in FIG. 1. Consequently, parts having similar function to each other are designated by the same symbol.

VG-GENERATOR is a voltage generating circuit for generating voltage VG being substantially equal to the precharge voltage Vcc/2, and has similar constitution to the voltage generating circuit constituted by the MOSFETs Q52 ~ Q57 in FIG. 1. Pa and Pb respectively designate control circuits each having similar constitution to the control circuit described in FIG. 1 (constituted by the MOSFETs Q58 ~ Q60 and the NOR gates G1, G2). However, as clearly seen from FIG. 10, signals $\phi$ms, SLa, axi, SLb, axi are supplied to the control circuits Pa, Pb in place of the signals $\phi$, $\phi$pc$^0$, PC0, $\phi$pc$^1$, PC1 described in FIG. 1. axi, $\overline{axi}$ are row series inner complementary address signals to determine whether the memory mat MMATa is selected or the memory mat MMATb is selected. SLa, SLb are sharing signals supplied to the sharing signal lines SLa, SLb. Also $\phi$ms is the control signal. For example, when the strobe signal $\overline{RAS}$ is varied from high level into low level, the control signal $\phi$ms is varied from high level into low level after a prescribed delay time.

The voltage VG formed by the voltage generating circuit VG-GENERATOR is supplied to respective control circuits Pa, Pb. Consequently, as clearly understood from the description using FIG. 1, when the control signal $\phi$ms is at high level, level of the sharing signals SLa, SLb becomes Vcc/2. On the other hand, if the control signal ms is made low level, according to the inner complementary address signals axi, $\overline{axi}$, one of the sharing signals SLa and SLb is made high level, and other is made low level. For example, when the inner address signal axi is at high level and the inner address signal $\overline{axi}$ is at low level, the sharing signal SLa is made high level and the sharing signal SLb is made low level. Thereby the sharing MOSFET in the memory mat MMATa is turned on, and the sharing MOSFET in the memory mat MMATb is turned off.

In FIG. 10, CB designates a capacitor for bootstrap. According to action of the capacitor CB for bootstrap and an inverter IV3, for example, high level of the sharing signal SLa is made value higher than the power source voltage Vcc in response to variation of the control signal $\phi$ms to low level.

In the embodiment, since the memory mats are two in number, a decoder is not particularly installed within the mat selecting circuit MATS. However, when the memory mats are increased in number, it is necessary that the decoder DEC as shown in FIG. 1 is installed and the control circuits are increased in number corresponding to this thereby various sorts of sharing signals are formed.

Effects obtained from the above-mentioned embodiments are as follows:

(1) Level of the precharge control signal supplied to gate of the precharge MOSFET which precharges the complementary data lines to half level is made half level during period from starting of the memory access until establishing of row series address at latest, and the precharge control signal corresponding to the memory mat selected according to the establishing of the row series address is converted from the half level into low level. In this constitution, since the precharge MOSFET can be substantially turned off irrespective of the establishing of address, selection timing of the word line can be made early and therefore high speed operation can be realized.

(2) According to above (1), level variation amount of control signal supplied to gate of the precharge MOSFET in selective memory mat/non-selective memory mat can be halved, thereby low consumption power can be realized.

(3) According to above (2), since the precharge signal is converted from half level into the ground potential of the circuit only regarding the memory mat to be selected, noise produced on the ground potential of the circuit can be reduced and the operation margin can be improved.

(4) In the memory access, only the sense amplifier corresponding to the memory mat where the memory cell to be selected exists is set to the operation state, thereby the low consumption power can be further realized together with effect of above (2).

(5) The mat selecting circuit MATS and the timing controller CONT previously set the level of the sharing signal lines SLa, SLb to that substantially equal to the precharge level of the complementary data lines at suitable timing before driving the prescribed word line to selective level, for example, at standby state, and start the complementary switch operation of the sharing MOSFETs Qla, Qlb before starting the subsequent amplifying operation of the sense amplifier SA, and further establish ON-state of the sharing MOSFET in the selective memory mat and OFF-state of the sharing MOSFET in the non-selective memory mat before establishing the amplifying operation of the sense amplifier SA. Thereby even if the selection drive operation of the word lines is performed without waiting establishing of the final switch state of the sharing MOSFETs Qla, Qlb, potential difference according to the storage data of the memory cell can be obtained on the complementary data lines in the selective memory mat without being subject to influence by parasitic capacitance of the complementary data lines in the non-selective memory mat. Consequently, access time in the DRAM of shared sense system can be reduced.

(6) Particularly, precharge circuits PCs, PCa, PCb respectively are arranged in each of the memory mats MMATa, MMATb and the sense amplifier column SAA, thereby the complementary data line pair to constitute the individual sense amplifier drive system can be precharged to the prescribed level irrespective of the switch state of the sharing MOSFETs Qla, Qlb, in other words, the sharing MOSFETs Qla, Qlb need not be once turned on during the precharge operation for the complementary data lines. Consequently, the level control of the sharing signal lines SLa, SLb can be simplified.

The invention made by the inventor has been described specifically by way of embodiments. However, the invention is not limited to the embodiments, but various modifications may be made without departing from the spirit of the invention.

For example, in the fourth embodiment, although the operation timing to force the sharing signal line to nearly equal level to the precharge level of the complementary data lines is described as the standby state of the DRAM, the level forcing may be performed rapidly at the timing after the chip selective state.

Also in the fourth embodiment, although timing of establishing the final level of the sharing signal line is described as relatively slow timing as shown in FIG. 9, the invention is not limited thereto but more rapid timing than that of the embodiment may be made according to circuit constitution to force the level of the sharing signal line.

Further in the fourth embodiment, although the sharing signal line is forced to nearly equal level to the precharge level of the complementary data lines, the precharge level of the sharing signal line need not be entirely equal to the precharge level of the bit line, but may be substantially equal to the precharge level of the complementary data lines in the meaning that each sharing MOSFET can maintain OFF-state at least even by small potential difference produced in the complementary data line pair by selection of the word line.

Also in the fourth embodiment, although the precharge circuits are installed respectively at both memory mats and the sense amplifier array so that each part of the complementary data lines can be precharged irrespective of the switch state of the sharing MOSFET, the invention is not limited thereto but one precharge circuit may be installed for one sense amplifier drive system. In this case, however, in order to set the complementary data lines to the precharge level, the sharing MOSFET must be once turned on and charge by precharging must be supplied to each part of the complementary data lines.

Although the turn intersecting system of the complementary data lines is adopted in the fourth embodiment, the invention is not limited thereto, and further the memory cell is not limited to one transistor type.

Also the idea described in the first through third embodiments may be naturally applied to the fourth embodiment. For example, in the embodiment of FIG. 7, the precharge signal $\phi pc$ may be made high level at chip non-selective state as shown in FIG. 2(c), and the level may be made half voltage during period from the chip selection until selection of the required word line at latest, the precharge signal for the selected memory mat may be made low level. In this constitution, further the low consumption power and the high speed operation can be realized. In this case, however, the precharge signal may be required to be formed by the circuit as shown in FIG. 1 corresponding to the memory mat. Also in this case, the number of the precharge circuit may be one in similar manner to the above description.

Further, the above-mentioned mat selecting circuit is not limited to the circuit constitution of FIG. 10, but various constitutions may be used.

Also, for example, the circuit constitution to convert the precharge control signal from high level into half level is not limited to that utilizing the half voltage generating circuit as above described, but, for example, circuit constitution that the constant-voltage circuit comprising the MOSFET of diode form in series connection is utilized and the discharge operation is performed to required half level, and other various modes may be adopted.

Further in FIG. 1, although the precharge control signal generating circuits P0~P3 respectively include the voltage generating circuits (MOSFETs Q52~Q57) and the control circuits (MOSFETs Q58~Q60 and the NOR gate circuits G1, G2), the precharge control signal generating circuits P0 ~P3 respectively may be constituted by the control circuits and the voltage generating circuits may be commonly used for respective precharge control circuits. In this case, half precharge voltage VG formed by the voltage generating circuits is supplied to each precharge control circuit. Consequently, the elements may be reduced in number.

Also in the non-selective memory mat, the precharge control signal may remain half level. The number of the memory mats may be two mats, eight mats and other various modes. In the constitution of four mats or eight mats, the selected memory mats and the non-selective memory mats may be equal in number.

In the various embodiments as above described, potential (half voltage) precharged to the data lines previously is utilized as reference voltage to discriminate the storage information of the memory cell. Consequently, a dummy cell is not particularly required, but may be installed so as to stabilize the operation. also a dummy cell to cancel noise may be installed. Further a refreshing address counter may be installed within the dynamic type RAM so as to provide the automatic refresh function.

Concrete circuit constitution of other peripheral circuits to constitute the dynamic type RAM may take various modes. For example, address signal may be supplied from external terminals being independent respectively.

In the embodiments as above described, the power source voltage Vcc is supplied to the unit sense amplifier. Consequently, the precharge level of the complementary data lines is made Vcc/2, and the precharge control signal pc before selecting the word line is made Vcc/2. However, for example, when voltage supplied to the unit sense amplifier is made lower than the power source voltage Vcc, since high level in the complementary data lines becomes lower than the power source voltage Vcc, the precharge level of the complementary data lines also becomes lower than Vcc/2. In this case, level of the precharge control signal φpc before selecting the word line also must be lowered so that the precharge MOSFET is turned off.

The invention is effective particularly for a dynamic type RAM where half precharge system is adopted, but can be applied also to a dynamic type RAM where complementary data lines are precharged to the power source voltage Vcc. The invention can be widely utilized in a dynamic type RAM having a plurality of memory mats with a memory array member being divided.

What is claimed is:

1. A semiconductor memory comprising:
   a plurality of first data lines with which input/output nodes of memory cells are coupled respectively;
   a plurality of amplifying means coupled with said first data lines, respectively, including means for applying a signal having a predetermined high level and a predetermined low level to said first data lines on the basis of storage information of the memory cells using an intermediate voltage between said predetermined high level and said predetermined low level precharged to said first data lines as a reference voltage;
   a plurality of first MOSFETs having either a source or a drain thereof coupled with said first data lines, respectively;
   a first signal line coupled with respective gates of said first MOSFETs; and
   voltage supply means coupled with said first signal line for applying a predetermined voltage substantially equal to the precharge voltage to said first signal line during a predetermined period after said semiconductor memory is selected.

2. A semiconductor memory as set forth in claim 13, further comprising word lines coupled with selective nodes of said memory cells respectively, and selecting means for selecting the word lines, wherein the precharge voltage is applied to drain or source of said first MOSFETs, and wherein said voltage supply means applies the prescribed voltage to said first signal line during a predetermined period after said semiconductor memory is selected until the word line is selected by said selecting means.

3. A semiconductor memory as set forth in claim 2, wherein said voltage supply means comprises first means for supplying a voltage to said first signal line to render said first MOSFETs conductive in response to non-selection of said semiconductor memory, and second means for converting a potential of said first signal line from the intermediate voltage into a predetermined other voltage which renders said first MOSFETs non-conductive during the operation of said amplifying means.

4. A semiconductor memory as set forth in claim 1, wherein said first MOSFETs are coupled between said data lines and said amplifying means.

5. A semiconductor memory as set forth in claim 4, further comprising a plurality of second data lines with which input/output nodes of the memory cells are coupled, respectively, second MOSFETs coupled between said second data lines, respectively, and said amplifying means, respectively, and a second signal line coupled between gates of said second MOSFETs and said voltage supply means, said voltage supply means comprising third means for applying a voltage substantially equal to said intermediate voltage precharged to said first and second data lines to said first and second signal lines during a predetermined period after said semiconductor memory is selected, and fourth means for applying a complementary potential to said first and second signal lines during the operation of said amplifying means.

6. A semiconductor memory comprising:
   a plurality of first complementary data line pairs;
   a first word line;
   a first memory mat including a plurality of first memory cells respectively coupled at input/output nodes thereof with one complementary data line among said first complementary data line pairs and coupled at selective nodes thereof with said first word line;
   first amplifier circuits coupled with said first complementary data line pairs for applying signals having a predetermined high level and a predetermined low level to said first complementary data line pairs on the basis of storage information of the first memory cells using an intermediate voltage between said predetermined high level and said predetermined low level precharged to said first complementary data line pairs as a reference voltage;
   a plurality of first precharge MOSFETs coupled at source-drain paths thereof between said first complementary data lines, respectively,
   wherein said first memory mat includes a first signal line coupled with a gate of said first precharge MOSFETs;
   a plurality of second complementary data line pairs;
   a second word line;
   a second memory mat including a plurality of second memory cells respectively coupled at input/output nodes thereof with one complementary data line among said second complementary data line pairs and coupled at selective nodes thereof with said second word line;
   second amplifier circuits coupled with said second complementary data line pairs for discriminating information of the second memory cells using a precharge voltage precharged to the complementary data lines as a reference voltage;

a plurality of second precharge MOSFETs coupled at source-drain paths thereof between said second complementary data lines, respectively, wherein said second memory mat includes a second signal line coupled with a gate of said second precharge MOSFETs;

selecting means coupled with said first and second word lines for selecting one of the first and second word lines; and control means coupled with said first and second signal lines for respectively applying a voltage substantially equal to the precharge voltage to said first and second signal lines during a predetermined time in response to selection of said semiconductor memory, and for respectively applying a prescribed voltage to render said first or second precharge MOSFETs non-conductive to the signal line in the memory mat having the word line to be selected during the operation of said first or second amplifier circuits.

7. A semiconductor memory as set forth in claim 6, wherein said control means comprises means for applying voltage to render said precharge MOSFETs conductive to the signal line in a memory mat other than the memory mat having the word line to be selected.

8. A semiconductor memory as set forth in claim 7, wherein said memory cells respectively comprise information storing capacitors, and MOSFETs connected at gates thereof to a selective node and connected at drain source paths thereof between said information capacitor and said input/output node.

9. A semiconductor memory comprising:

a sense amplifier for determining an attained level of a data line with which memory cells are coupled, wherein said data line is coupled at a coupling node with an input/output terminal of said sense amplifier, extends on both sides of the coupling node through first and second sharing switch elements, respectively, wherein a first memory cell is coupled to one side of the data line and a second memory cell is coupled to the other side of the data line; and a precharge circuit including means for forcing a level of a selective terminal of the first or second sharing switch elements to a predetermined level nearly equal to a precharge level of the data line at a prescribed timing before a selection operation of one of the first or second memory cells, and for operating the first and second sharing switch elements in a complementary switch operation before starting a subsequent operation of the sense amplifier, wherein the precharge level is an intermediate voltage between a predetermined high level and a predetermined low level formed by said sense amplifier.

* * * * *